(12) United States Patent
Yamakoshi

(10) Patent No.: US 11,217,599 B2
(45) Date of Patent: Jan. 4, 2022

(54) SEMICONDUCTOR MEMORY DEVICE WITH SELECT TRANSISTOR DRAIN REGION CONNECTED TO MEMORY TRANSISTOR SOURCE REGION

(71) Applicant: RENESAS ELECTRONICS CORPORATION, Tokyo (JP)

(72) Inventor: Hideaki Yamakoshi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 81 days.

(21) Appl. No.: 16/737,571

(22) Filed: Jan. 8, 2020

(65) Prior Publication Data
US 2020/0243545 A1    Jul. 30, 2020

(30) Foreign Application Priority Data
Jan. 25, 2019    (JP) .............................. JP2019-011525

(51) Int. Cl.
*H01L 27/1157* (2017.01)
*H01L 29/423* (2006.01)

(52) U.S. Cl.
CPC .... *H01L 27/1157* (2013.01); *H01L 29/42344* (2013.01)

(58) Field of Classification Search
CPC ......... H01L 27/11524; H01L 27/11529; H01L 27/11563; H01L 27/11565; H01L 27/1157; H01L 29/4234; H01L 29/42324; H01L 29/42328; H01L 29/42344; H01L 29/792
See application file for complete search history.

(56) References Cited

U.S. PATENT DOCUMENTS 7,011,999 B2    3/2006  Minami et al.
2018/0315481 A1*  11/2018  Lin ........................ G11C 16/26

FOREIGN PATENT DOCUMENTS

JP    2004-200504 A    7/2004

* cited by examiner

*Primary Examiner* — Nelson Garces
(74) *Attorney, Agent, or Firm* — McDermott Will & Emery LLP

(57) ABSTRACT

A plurality of select transistors are formed in a first region of a semiconductor substrate, a plurality of memory transistors are formed in a second region of the semiconductor substrate, and a drain region of the select transistor and a source region of the memory transistor are electrically connected to form a memory cell. Here, the first region and the second region are arranged with each other in a gate width direction of the select transistor and the memory transistor.

14 Claims, 13 Drawing Sheets

SEMICONDUCTOR MEMORY DEVICE WITH SELECT TRANSISTOR DRAIN REGION CONNECTED TO MEMORY TRANSISTOR SOURCE REGION

CROSS-REFERENCE TO RELATED APPLICATIONS

The disclosure of Japanese Patent Application No. 2019-011525 filed on Jan. 25, 2019 including the specification, drawings and abstract is incorporated herein by reference in its entirety.

BACKGROUND

This invention relates to semiconductor device, and more particularly to semiconductor device and manufacturing method with MONOS memories.

As one of the nonvolatile memories, there is known a MONOS (Metal Oxide Nitride Oxide Semiconductor) memory having a FET (Field Effect Transistor) structure and storing data by storing charges in an ONO (Oxide Nitride Oxide) film formed between a gate electrode and a substrate.

Japanese Unexamined Patent Application Publication No. 2004-200504 discloses a semiconductor integrated circuit device including one MONOS type nonvolatile memory device and one select MISFET.

SUMMARY

When the MONOS type memory transistor and the select transistor connected to the memory transistor are arranged side by side in a gate length direction of the transistors, it is conceivable to separately form a gate dielectric film of the memory transistor and a gate dielectric film of the select transistor on an active region between the transistors. In this case, a gate electrode is formed on the gate dielectric film and the substrate due to misalignment between a dimension of the device and photolithography process, or the like, which may cause a problem that the breakdown voltage of the transistor is remarkably lowered. That is, when the memory transistor and the select transistor are arranged side by side in the gate length direction, the reliability of the semiconductor device may deteriorate.

Other objects and novel features will be apparent from the description of the specification and the accompanying drawings.

The typical ones of the embodiments disclosed in the present application will be briefly described as follows.

In embodiments, a semiconductor device includes a select transistor formed on a first region of a semiconductor substrate and having a first gate electrode extending in a first direction along an upper surface of the semiconductor substrate, and a MONOS type memory transistor formed on a second region of the semiconductor substrate arranged in a first direction with the first region and having a second gate electrode extending in the first direction. Here, a source region of the memory transistor is electrically connected to a drain region of the select transistor.

According to the embodiments disclosed in the present application, the reliability of the semiconductor device can be improved. In particular, the breakdown voltage of the transistors can be prevented from decreasing.

DETAILED DESCRIPTION

Figure 1:
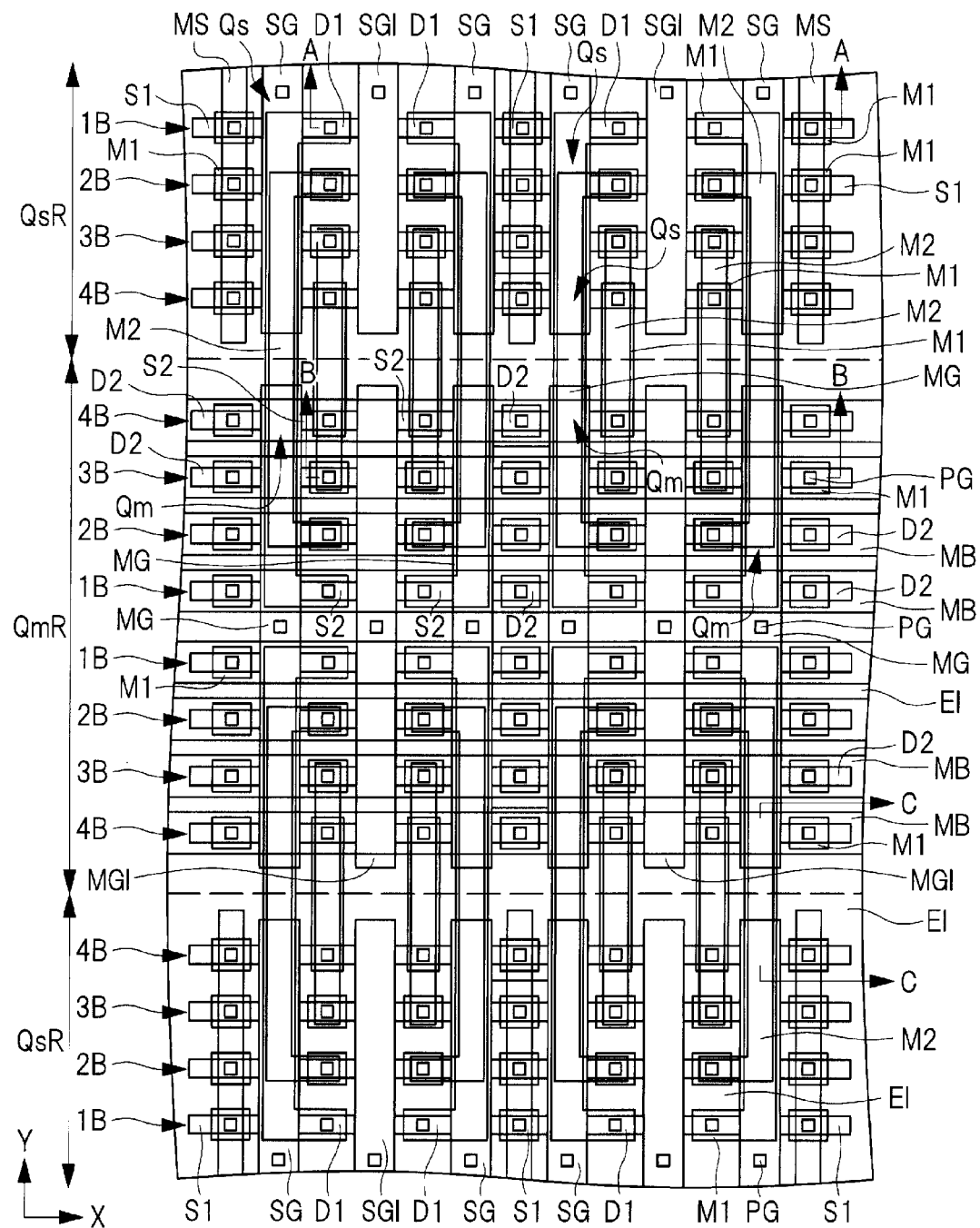
FIG. 1 is a plan view of a semiconductor device according to first embodiment.

In the following embodiments, the description will be made by dividing into a plurality of sections or embodiments for the sake of convenience, but unless otherwise specified, they are not independent of each other, and one is related to the modification, detail, supplementary description, or the like of part or all of the other. In addition, in the following embodiments, the number of elements or the like (including the number, the amount, the range, and the like) is not limited to the mentioned number, except the case where it is specified in particular or the case where it is obviously limited to a specific number in principle, and may be equal to or more than the mentioned number or may be equal to or less than the mentioned number.

Furthermore, in the following embodiments, the constituent elements (including element steps and the like) are not necessarily essential except for the case in which they are specifically specified, the case in which they are considered to be obviously essential in principle, and the like. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail with reference to the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary. In addition, in the drawings for explaining the embodiments, hatching may be applied to a plan view, a perspective view, or the like in order to make the configuration easy to understand.

First Embodiment

Figure 2:
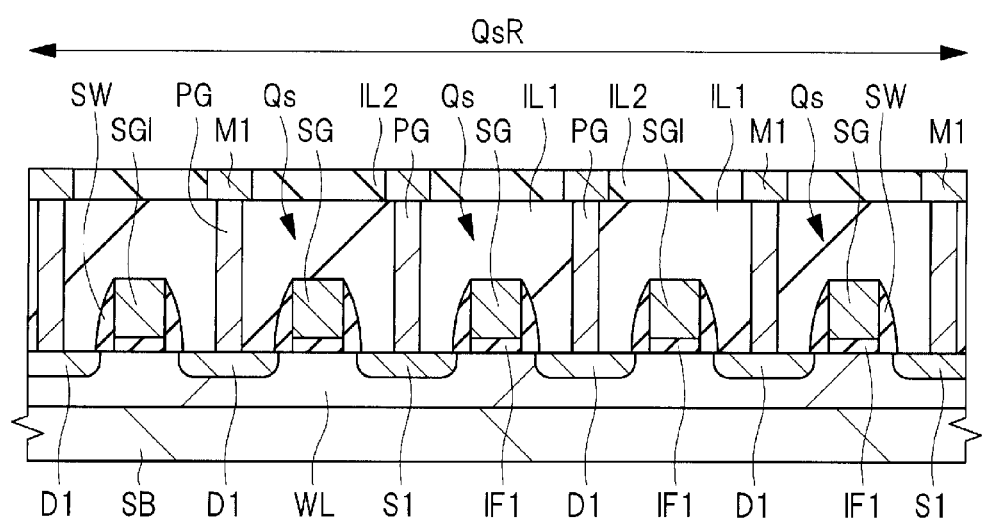
FIG. 2 is a cross-sectional view taken along line A-A of FIG. 1.
Figure 3:
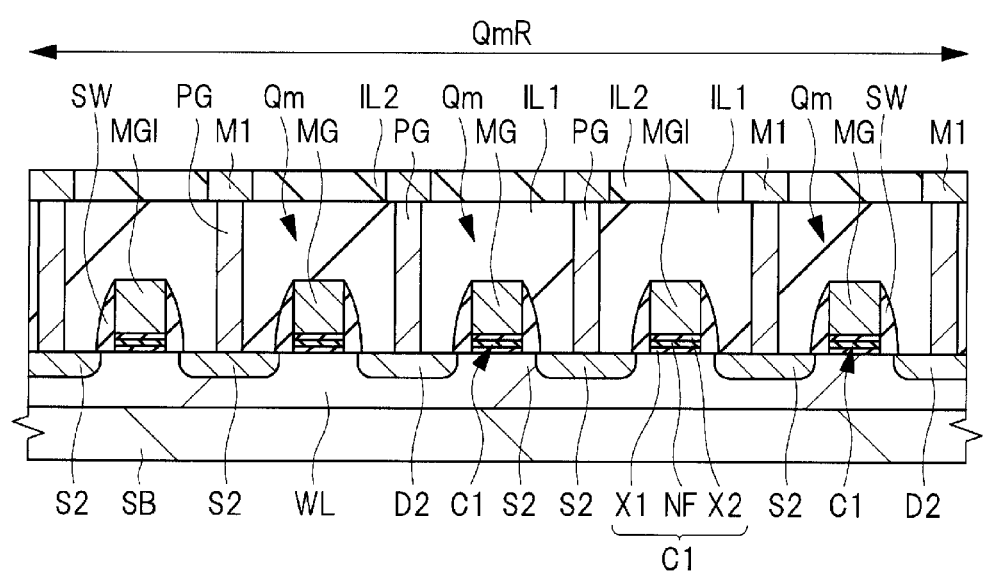
FIG. 3 is a cross-sectional view taken along line B-B of FIG. 1.
Figure 4:
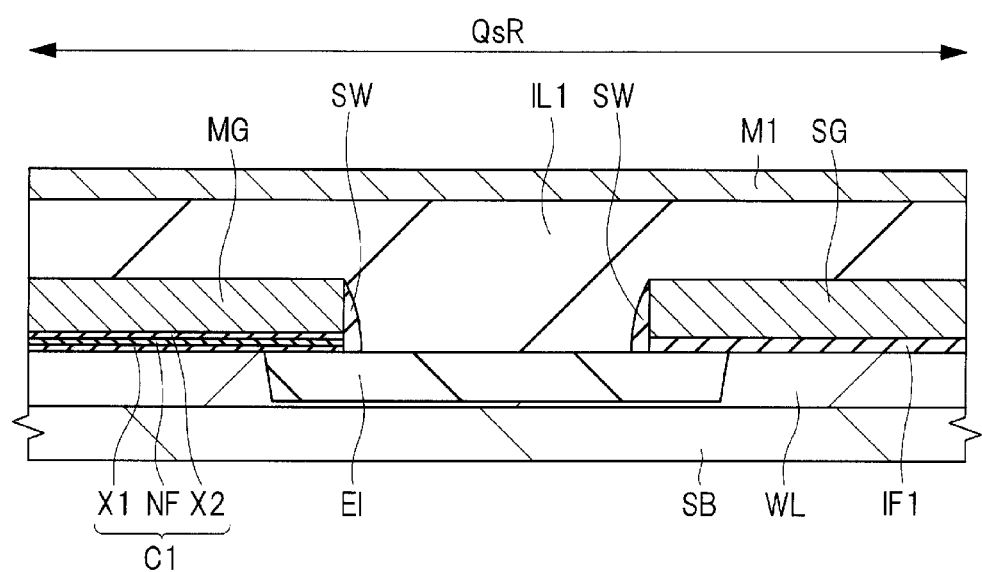
FIG. 4 is a cross-sectional view taken along line C-C of FIG. 1.

A semiconductor device according to first embodiment has a MONOS type memory transistor formed of a transistor having an ONO film including a charge storage portion as a gate dielectric film, and a select transistor of the memory transistor, and is mainly characterized in that regions where these transistors are formed, which are electrically connected to each other, are arranged in a gate length direction.
Structure of Semiconductor Device Hereinafter, the structure of the semiconductor device according to the present embodiment will be described with reference to FIGS. 1 to 4. FIG. 1 is a plan view of a semiconductor device according to the present embodiment. FIGS. 2, 3 and 4 are cross-sectional view of the semiconductor device according to the present embodiment. FIG. 2 shows a cross section taken along line A-A of FIG. 1, FIG. 3 shows a cross section taken along line B-B of FIG. 1, and FIG. 4 shows a cross section taken along line C-C of FIG. 1. Note that FIG. 1 shows a first layer wiring M1, a wiring M2 on the wiring M1, and a wiring MB and a wiring MS on the wiring M2 in a stacked wiring on a device, but wiring layers over the wiring M1 are not shown in FIGS. 2 and 3. FIG. 2 shows a cross section of a first region QsR, FIG. 3 shows a cross section of a second region QmR, and FIG. 4 shows a cross section including a boundary between the first region QsR and the second region QmR. In FIG. 4, interlayer insulating films, plugs, and the wiring layers are not shown.

Although a silicide layer may be formed on an upper surface of each of an active region (source and drain region) and the gate electrode, the silicide layer is not described and illustrated. An insulating film used as a hard mask for patterning the gate electrode may be formed on each of the gate electrodes, but description and illustration thereof are omitted here.

FIG. 1 shows a plan view of a memory array. In the memory array, a first region (select element region) QsR in which a plurality of select transistors Qs are formed side by side and a second region (nonvolatile memory element region) QmR in which a plurality of memory transistors Qm are formed side by side, are arranged. The first region QsR and the second region QmR are regions arranged in the upper surface of the semiconductor substrate and adjacent to each other in a Y direction. Each of the Y direction and a X direction is a direction along the upper surface of the semiconductor substrate, and the Y direction and the X direction are perpendicular to each other in plan view.

In FIG. 1, the interlayer insulating film and a sidewall spacer are not shown. The gate dielectric film covering a part of the active region is not shown in FIG. 1 because it is located under each of the gate electrodes. In FIG. 1, the wiring electrically connected to each of the gate electrodes is not shown. In FIG. 1, the other wirings, the active regions (source and drain regions) in the semiconductor substrate, the plugs, the gate electrodes and the like which are located under the wirings are shown in a transparent manner. However, in FIG. 1, the illustration of vias connecting the upper and lower wiring is omitted. Further, in FIG. 1, the wiring of the lower layer may be shown thicker than the wiring of the upper layer in order to make the arrangement of the wiring easy to understand, but a width of the wiring of the upper layer in plan view may have a size equal to or larger than a width of the wiring of the lower layer. In FIG. 1, the boundary between the first region QsR and the second region QmR is shown by a broken line.

As shown in FIGS. 2 to 4, the semiconductor device according to the present embodiment has a semiconductor substrate SB. The semiconductor substrate SB is made of, for example, p-type monocrystalline silicon having a resistivity of about 1 to 10 Ωcm. The semiconductor substrate SB has a first region QsR and a second region QmR arranged in a Y direction along an upper surface of the semiconductor substrate SB. Each of the first region QsR and the second region QmR has a width of, for example, 2.5 μm in the Y direction. A well WL, which is a p-type semiconductor region, is formed in the semiconductor substrate SB from the upper surface of the semiconductor substrate to a predetermined depth. As shown in FIGS. 1 and 4, a trench (concave portion) is formed in a part of the upper surface of the semiconductor substrate SB, and the insulating film embedded in the trench configures an element isolation region (element isolation film, element isolation insulating film) EI. That is, the element isolation region EI is formed on the semiconductor substrate SB. The insulating film is mainly formed of, for example, a silicon oxide film. Here, a part of the upper surface of the semiconductor substrate SB shown in FIGS. 1 to 4, which is exposed from the element isolation region EI, is referred to as an active region.

As shown in FIGS. 1 and 2, in the first region QsR, a plurality of select gate electrodes SG extending in the Y direction are arranged side by side in the X direction on the semiconductor substrate SB via gate dielectric films IF1. However, one dummy select gate electrode SGI having the same shape (layout) as that of the select gate electrode SG is formed between a pair of select gate electrodes SG adjacent to each other in the X direction and the other pair of select gate electrodes SG adjacent to each other in the X direction. That is, in the X direction, two select gate electrodes SG and one dummy select gate electrode SGI are alternately arranged. In other words, in the X direction, another select gate electrode SG is arranged on one side of the select gate electrode SG, and a dummy select gate electrode SGI is arranged on the other side. That is, each of the select gate electrode SG is sandwiched between another select gate electrode SG and the dummy select gate electrode SGI.

In plan view, a drain region D1 is formed in an active region between the select gate electrode SG and the dummy select gate electrode SGI adjacent to each other in the X direction. That is, the dummy select gate electrode SGI is sandwiched between two drain regions D1 in plan view. The gate dielectric film IF1 has the same layouts as those of the select gate electrode SG and the dummy select gate electrode SGI in a region overlapping with each of the select gate electrode SG and the dummy select gate electrode SGI in plan view.

The dummy select gate electrode SGI is a pseudo gate electrode to which a 0 V is applied during read operation of the semiconductor substrate, and is not a component of any of a switching element, a memory transistor, and the other transistor. That is, although the dummy select gate electrode SGI does not configure a transistor, if it is assumed that the dummy select gate electrode SGI configures a transistor, a voltage (0 V) is applied to the dummy select gate electrode SGI so as to turn off the transistor during read operation of the memory cell. However, the dummy select gate electrode SGI configures a circuit. In addition, a potential can be supplied to the dummy select gate electrode SGI, and the dummy select gate electrode SGI is not in an electrically floating state.

In the semiconductor substrate SB between the select gate electrodes SG adjacent to each other in the X direction (gate length direction), a source region S1, which is an n-type semiconductor region, is formed from the upper surface of the semiconductor substrate SB to a predetermined depth. In the semiconductor substrate SB between the select gate electrode SG and the dummy select gate electrode SGI adjacent to each other in the X direction (gate length direction), a drain region D1, which is an n-type semiconductor region, is formed from the upper surface of the semiconductor substrate SB to a predetermined depth. The source region S1 and the drain region D1 have the same depth and are formed shallower than the well WL.

Under each of the select gate electrode SG and the dummy select gate electrode SGI is a region (channel region) in which neither the source region S1 nor the drain region D1 is formed. That is, the select gate electrode SG is formed on the semiconductor substrate SB sandwiched between the source region S1 and the drain region D1 via the gate dielectric film IF1. That is, in plan view, the select gate electrode SG is sandwiched between the source region S1 and the drain region D1. The select gate electrode SG is formed of, for example, a polysilicon film. The pair of source region S1 and drain region D1 and the select gate electrode SG between the source region S1 and drain region D1 configure a select transistor Qs which is a MISFET (Metal Insulator Semiconductor Field Effect Transistor). The select transistor Qs is a switching element used for selecting a memory transistor Qm to be described later.

The dummy select gate electrode SGI has a function of electrically isolating the select transistors Qs adjacent to each other, and when the dummy select gate electrode SGI is not formed, it is necessary to form the element isolation region EI under the region where the dummy select gate electrode SGI is formed in FIGS. 1 and 2. The two select transistors Qs arranged in the X direction in the region sandwiched between the two dummy select gate electrodes SGI share one source region S1.

The gate dielectric film IF1 has a film thickness similar to that of gate dielectric film (I/O oxide film) which configures a MISFET of high withstand voltage used for input and output of power supply voltages in semiconductor device (semiconductor chip), and has a film thickness larger than that of gate dielectric film which configures a MISFET of low withstand voltage used in logic circuits, for example.

As shown in FIGS. 1 and 3, in the second region QmR, a part of the upper surface of the semiconductor substrate SB is covered with an ONO (Oxide Nitride Oxide) film C1. The ONO film C1 includes a silicon oxide film X1 formed by thermally oxidizing the surface of the semiconductor substrate SB made of silicon, a silicon nitride film NF formed on the silicon oxide film X1, and a silicon oxide film X2 formed on the silicon nitride film NF. The silicon nitride film NF is a charge storage portion (charge storage film, charge storage layer) of the memory transistor Qm.

On the ONO film C1, a plurality of memory gate electrodes MG extending in the Y direction are arranged side by side in the X direction. However, between a pair of memory gate electrodes MG adjacent to each other in the X direction and another pair of memory gate electrodes MG adjacent to each other in the X direction, a dummy memory gate electrode MGI having the same shape (layout) as that of one memory gate electrode MG is formed. That is, in the X direction, two memory gate electrodes MG and one dummy memory gate electrode MGI are alternately arranged. In other words, in the X direction, another memory gate electrode MG is arranged on one side of the memory gate electrode MG, and the dummy memory gate electrode MGI is arranged on the other side. That is, each memory gate electrode MG is sandwiched between another memory gate electrode MG and a dummy memory gate electrode MGI.

In plan view, a source region S2 is formed in an active region between the memory gate electrode MG and the dummy memory gate electrode MGI adjacent to each other in the X direction. That is, the dummy memory gate electrode MGI is sandwiched between two source regions S2 in plan view. The ONO film C1 has the same layout as each of the memory gate electrode MG and the dummy memory gate electrode MGI in a region overlapping each of the memory gate electrode MG and the dummy memory gate electrode MGI in plan view.

The dummy memory gate electrode MGI is a pseudo gate electrode to which a 0 V is applied during read operation of the semiconductor device, and the dummy memory gate electrode MGI is not a component of any of a switching element, a memory transistor, and another transistor. That is, although the dummy memory gate electrode MGI does not configure a transistor, if it is considered that the dummy memory gate electrode MGI configures a transistor, a voltage (0 V) is applied to the dummy memory gate electrode MGI so as to turn off the transistor during read operation of the memory cell. However, the dummy memory gate electrode MGI configures a circuit. In addition, a potential can be supplied to the dummy memory gate electrode MGI, and the dummy memory gate electrode MGI is not in an electrically floating state.

In the semiconductor substrate SB between the memory gate electrodes MG adjacent to each other in the X direction (gate length direction), a drain region D2, which is an n-type semiconductor region, is formed from the upper surface of the semiconductor substrate SB to a predetermined depth. In the semiconductor substrate SB between the memory gate electrode MG and the dummy memory gate electrode MGI adjacent to each other in the X direction (gate length direction), a source region S2, which is an n-type semiconductor region, is formed from the upper surface of the semiconductor substrate SB to a predetermined depth. The source region S2 and the drain region D2 have the same depth and are formed shallower than the well WL.

Under each of the memory gate electrode MG and the dummy memory gate electrode MGI is a region (channel region) in which neither the source region S2 nor the drain region D2 is formed. That is, the memory gate electrode MG is formed on the semiconductor substrate SB sandwiched between the source region S2 and the drain region D2 via the ONO film C1. That is, in plan view, the memory gate electrode MG is sandwiched between the source region S2 and the drain region D2. The memory gate electrode MG is formed of, for example, a polysilicon film. The pair of the source region S2 and the drain region D2 and the memory gate electrode MG between the source region S2 and the drain region D2 configure a MISFET, and the MISFET and the ONO film C1 configure the memory transistor (nonvolatile memory element) Qm. The memory transistor Qm is an element used for storing information by storing charges. That is, the memory transistor Qm including the ONO film C1 is a MONOS (Metal Oxide Nitride Oxide Semiconductor) type memory element.

The dummy memory gate electrode MGI has a function of electrically isolating the memory transistors Qm adjacent to each other, and when the dummy memory gate electrode MGI is not formed, it is necessary to form the element isolation region EI under the region where the dummy memory gate electrode MGI is formed in FIGS. 1 and 3. Two memory transistors Qm arranged in the X direction in a region sandwiched between two dummy memory gate electrodes MGI share one drain region D2.

The source regions S1 and S2 and the drain regions D1 and D2 are regions in which n-type impurities (for example, P (phosphorus) or As (arsenic)) are introduced into the semiconductor substrate SB, and the well WL is a region in which p-type impurities (for example, B (boron)) are introduced into the semiconductor substrate SB. Each of the source regions S1, S2 and the drain regions D1 and D2 has an extension region having a relatively low impurity concentration and a diffusion region having an impurity concentration higher than that of the extension region. The extension region is adjacent to the diffusion region and located closer to the channel region than the diffusion region.

As shown in FIG. 1, the select gate electrode SG and the memory gate electrode MG are arranged in the Y direction (gate width direction) with the boundary between the first region QsR and the second region QmR interposed therebetween. The dummy select gate electrode SGI and the dummy memory gate electrode MGI are arranged in the Y direction across a boundary between the first region QsR and the second region QmR.

As shown in FIG. 4, the element isolation region EI is formed on the semiconductor substrate SB at the boundary between the first region QsR and the second region QmR. The select gate electrode SG, the memory gate electrode MG, the gate dielectric film IF1, and the ONO film C1 all terminate on the element isolation region EI. In other words, a terminal end portion of each of the select gate electrode SG, the memory gate electrode MG, the gate dielectric film IF1, and the ONO film C1 in the Y direction is located on the element isolation region EI. The select gate electrode SG and the memory gate electrode MG are separated from each other across the boundary, and the gate dielectric film IF1 and the ONO film C1 are separated from each other across the boundary. That is, the end portion of the gate dielectric film IF1 and the end portion of the ONO film C1 that face each other across the boundary terminate on the element isolation region EI.

As shown in FIGS. 2 and 3, sidewall spacers SW are formed so as to cover the respective side surfaces of the select gate electrode SG and the memory gate electrode MG. The sidewall spacer SW is formed of an insulating film formed in a self-aligned manner, and is formed of, for example, a stacked film of a silicon oxide film and a silicon nitride film. On the semiconductor substrate SB, an interlayer insulating film IL1 is formed to cover the gate dielectric film IF1, the ONO film C1, the select gate electrode SG, the memory gate electrode MG, the dummy select gate electrode SGI, the dummy memory gate electrode MGI, and the sidewall spacers SW. The interlayer insulating film IL1 is mainly formed of, for example, a silicon oxide film, and the upper surface of the interlayer insulating film IL1 is flattened. Although not shown, a liner insulating film (silicon nitride film) thinner than the silicon oxide film configuring the interlayer insulating film IL1 may be formed between the interlayer insulating film IL1 and the gate dielectric film IF1, the ONO film C1, the select gate electrode SG, the memory gate electrode MG, the dummy select gate electrode SGI, the dummy memory gate electrode MGI, and the sidewall spacers SW.

As shown in FIGS. 1 to 3, a plurality of contact holes (through holes) penetrating the interlayer insulating film IL1 are formed in the interlayer insulating film IL1, and plugs (contact plugs) PG, which are conductive connecting portions, are formed in the respective contact holes. The plugs PG are electrically connected to the source regions S1 and S2, the drain regions D1 and D2, the select gate electrode SG, the memory gate electrode MG, the dummy select gate electrode SGI, and the dummy memory gate electrode MGI, respectively.

Although not shown, silicide layers formed of NiSi (nickel silicide), CoSi (cobalt silicide), or the like may be formed on the upper surface of each of the source regions S1 and S2, the drain regions D1 and D2, the select gate electrode SG, the memory gate electrode MG, the dummy select gate electrode SGI, and the dummy memory gate electrode MGI. In this case, the plugs PG are electrically connected to the source regions S1 and S2, the drain regions D1 and D2, the select gate electrode SG, the memory gate electrode MG, the dummy select gate electrode SGI, or the dummy memory gate electrode MGI via the silicide layers. The plugs PG are formed of, for example, tungsten.

The upper surfaces of the plugs PG are planarized at the same height as the upper surface of the interlayer insulating film IL1. An interlayer insulating film IL2 formed of, for example, a silicon oxide film is formed on each of the plugs PG and the interlayer insulating film IL1. The interlayer insulating film IL2 has a plurality of through holes (wiring trenches), and the wirings M1 are embedded in the through holes. The upper surfaces of the wirings M1 and the upper surface of the interlayer insulating film IL2 are flattened at the same height. The upper surfaces of the plugs PG are connected to the lower surfaces of the wirings M1 formed on the interlayer insulating film IL1. The wirings M1 are mainly formed of Cu (Copper), for example. The wirings M1 and the interlayer insulating film IL2 configure a first wiring layer.

As shown in FIG. 1, wirings M2 electrically connected to the wirings M1 through vias (not shown) are formed on the wirings M1. Wirings MB and MS electrically connected to the wirings M2 through vias (not shown) are formed on the wirings M2. The wirings M2 configures a second wiring layer. Each of the wirings MB and MS may configure a third wiring layer on the second wiring layer, or may configure a wiring layer over the third wiring layer. Although not shown, potentials are supplied to the respective gate electrodes by using, for example, wirings of the fourth wiring layer.

One select transistor Qs is electrically connected to one memory transistor Qm. Specifically, the drain region D1 of one select transistor Qs is electrically connected to the source region S2 of one memory transistor Qm via plugs PG and wiring M1. However, in present embodiment, there are a case where the wiring M2 is included as a conductive path connecting the select transistor Qs and the memory transistor Qm, and a case where the wiring M2 is not included. The select transistor Qs and the memory transistor Qm electrically connected to each other configure one memory cell, that is, one bit cell. In other words, one bit cell is configured to two transistors.

The select transistors Qs arranged in the Y direction in the first region QsR configure different bit cells. The select transistors Qs arranged in the X direction in the first region QsR configure different bit cells. The memory transistors Qm arranged in the Y direction in the second region QmR configure different bit cells. The memory transistors Qm arranged in the X direction in the second region QmR configure different bit cells. That is, the memory transistors Qm for 8 bits are arranged in the Y direction in one second region QmR shown in FIG. 1, and the select transistors Qs for 4 bits are arranged in the Y direction in one first region QsR shown in FIG. 1. Although not shown in FIG. 1, since the first region QsR further has a structure that is line-symmetrical in the Y direction about a line that overlaps with the plug PG connected to the select gate electrode SG and extends along the X direction as an axis, the select transistors Qs for 8 bits are actually arranged in the Y direction in one first region QsR. The number of transistors arranged in the Y direction in the first region QsR and the second region QmR is not limited to eight.

FIG. 1 shows a first bit region 1B in which the select transistor Qs and the memory transistor Qm configuring a first memory cell (first bit) are formed in each of the first region QsR and the second region QmR. Similarly, FIG. 1 shows a second bit region 2B in which the select transistor Qs and the memory transistor Qm configuring a second memory cell (second bit) are formed. Similarly, a third bit region 3B in which the select transistor Qs and the memory transistor Qm configuring a third memory cell (third bit) are formed, and a fourth bit region 4B in which the select transistor Qs and the memory transistor Qm configuring a fourth memory cell (fourth bit) are formed are also shown. That is, the select transistor Qs formed in the first bit region 1B of the first region QsR is connected to the memory transistor Qm formed in the first bit region 1B of the second region QmR. This also applies to the second bit region 2B, the third bit region 3B, and the fourth bit region 4B.

In the first bit region 1B, a transistor configuring each of a plurality of bits in the X direction are formed. This also applies to the second bit region 2B, the third bit region 3B, and the fourth bit region 4B.

In each of the first region QsR and the second region QmR, the fourth bit region 4B, the third bit region 3B, the second bit region 2B, and the first bit region 1B are arranged in the Y direction in order from the boundary between the first region QsR and the second region QmR. That is, in the Y direction, the first bit region 1B, the second bit region 2B, the third bit region 3B, and the fourth bit region 4B of the first region QsR, and the first bit region 1B, the second bit region 2B, the third bit region 3B, and the fourth bit region 4B of the second region QmR are arranged line symmetrically with respect to each other with the boundaries as axes. Therefore, a distance between the fourth bit region 4B of the first region QsR and the fourth bit region 4B of the second region QmR is smaller than a distance between the first bit region 1B of the first region QsR and the first bit region 1B of the second region QmR.

Here, a distance from the boundary between the first region QsR and the second region QmR in the Y direction to the active region closest to the boundary (the active region of the fourth bit region 4B) is 200 nm to 400 nm. That is, although depending on the specification of the semiconductor device, the boundary separating the gate dielectric film IF1 and the ONO film C1 and the active region need to be separated by 200 nm or more. In other words, the active region of the first region QsR and the active region of the second region QmR sandwiching the boundary are separated from each other by 400 nm to 800 nm. The select transistor Qs and the memory transistor Qm are separated from each other via the element isolation region EI, thereby electrically isolating the select transistor Qs and the memory transistor Qm from each other.

In FIG. 1, two first bit regions 1B, two second bit regions 2B, two third bit regions 3B, and two fourth bit regions 4B are shown in the second region QmR. That is, eight bit regions are shown in the second region QmR. Here, in the second region QmR, the first bit regions 1B arranged in line symmetry in the Y direction around the plugs PG connected to the memory gate electrodes MG are denoted by the same reference numerals in FIG. 1, but they configure different bits, and the two first bit regions 1B do not configure one bit. This also applies to the second bit regions 2B, the third bit regions 3B, and the fourth bit regions 4B, which are arranged two by two in the second region QmR.

In each bit region of the first region QsR and the second region QmR, a plurality of active regions extending in the X direction are arranged side by side in the Y direction. The wiring MB extending in the X direction are formed over each of the eight active regions arranged in the Y direction in the second region QmR. That is, eight wirings MB are arranged in the Y direction in the upper portion of the second region QmR. The wirings MB are so-called bit lines. The wirings MB are electrically connected to the drain regions D2 of the memory transistors Qm via the wirings M1 and M2 under the wirings MB and the plugs PG. One wiring MB is commonly connected to the drain regions D2 of the plurality of memory transistors Qm arranged in the X direction.

Wirings MS, which are source wirings extending in the Y direction, are formed over the source regions S1 of the first region QsR. The wirings MS are wirings for supplying source potentials to the source regions S1 of the select transistors Qs. The wirings MS are electrically connected to the source regions S1 of the select transistors Qs via the wirings M1, M2 and the plugs PG under the wirings MS. One wiring MS is commonly connected to the source regions S1 of the plurality of select transistors Qs arranged in the Y direction.

From the viewpoint of reducing the layout area, the select transistor Qs and the memory transistor Qm configuring one memory cell (bit) are electrically connected to each other by a wiring having a line-symmetric layout with the boundary of the first region QsR and the second region QmR as an axis. The two transistors formed in the fourth bit region 4B, that is, the select transistor Qs and the memory transistor Qm which are adjacent to each other in plan view across the boundary, are linearly connected by a first wiring M1 extending in the Y direction. The select transistor Qs and the memory transistor Qm formed in the third bit region 3B are linearly connected by a first wiring M2 extending in the Y direction. The wiring M2 connecting the select transistor Qs and the memory transistor Qm formed in the third bit region 3B and the wiring M1 connecting the select transistor Qs and the memory transistor Qm formed in the fourth bit region 4B overlap each other in plan view over the boundary between the first region QsR and the second region QmR.

The select transistor Qs and the memory transistor Qm formed in the second bit region 2B are adjacent to each other in the X direction to the first wiring M2 that connects the two transistors formed in the fourth bit region 4B, and are connected by a second wiring M2 that is arranged so as to bypass the first wiring M2, passing directly over the select gate electrode SG and the memory gate electrode MG, respectively. The select transistor Qs and the memory transistor Qm formed in the first bit region 1B are adjacent to each other in the X direction to the first wiring M1 that connects the two transistors formed in the third bit region 3B, and are connected by a second wiring M1 that is arranged directly over each of the select gate electrode SG and the memory gate electrode MG and that bypasses the first wiring M1 through under the second wiring M2. The wiring M1 connecting the select transistor Qs and the memory transistor Qm formed in the first bit region 1B and the wiring M2 connecting the select transistor Qs and the memory transistor Qm formed in the second bit region 2B overlap each other in plan view over the boundary between the first region QsR and the second region QmR.

The select transistor Qs and the memory transistor Qm formed in the second bit region 2B may be connected by the second wiring M1, and the select transistor Qs and the memory transistor Qm formed in the first bit region 1B may be connected by the second wiring M2. One end portion of each of the first wiring M1, the second wiring M1, the first wiring M2, and the second wiring M2 described here is connected to one of the four drain regions D1 arranged in the Y direction via plugs PG or the like, and the other end portion is connected to one of the four source regions S2 arranged in the Y direction. The four drain regions D1 and the four source regions S2 are arranged each other in the Y direction.

As described above, the four sets of select transistors Qs and the memory transistor Qm arranged in the Y direction are electrically connected by using the first wiring M1, the second wiring M1, the first wiring M2, and the second wiring M2 having layouts inverted with the boundary between the first region QsR and the second region QmR as an axis. As a result, the four sets of the select transistors Qs and the memory transistors Qm can be electrically connected only by the wiring, the plugs, and the vias arranged within the area occupied by the two wiring arranged in the X direction in plan view, so that the planar layout of the memory array can be reduced and the semiconductor device can be miniaturized.

FIG. 1 shows a case where four sets of select transistors Qs and memory transistors Qm arranged in the Y direction are connected to each other. On the other hand, when the number of select gate electrodes SG arranged in the Y direction in the first region QsR and the number of memory gate electrodes MG arranged in the Y direction in the second region QmR are further increased, as a wiring for connecting the select transistor Qs and the memory transistor Qm, it is sufficient to use a wiring which is in an upper layer of the wiring M2 and directly over each of the first wiring M1 and the second wiring M1.

Operation of Semiconductor Device

Figure 5:
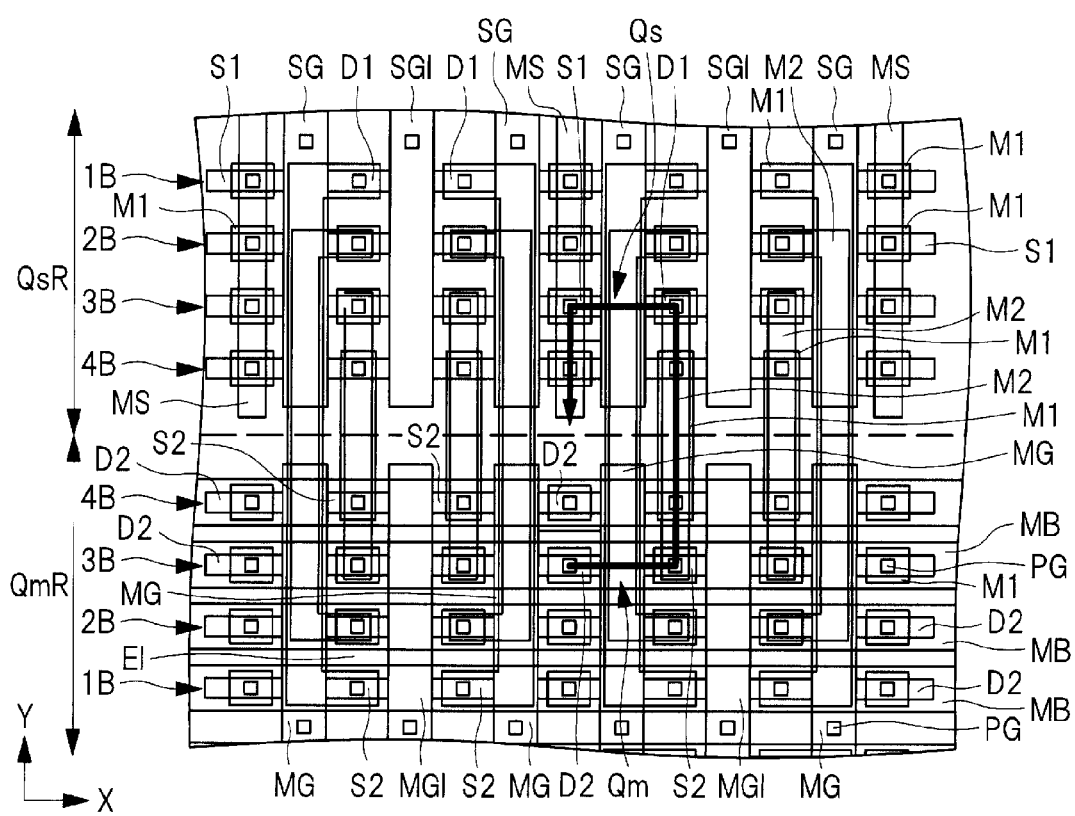
FIG. 5 is a plan view showing a current flow during read operation of the semiconductor device according to the first embodiment.

The operation of the memory cell according to the present embodiment will be described below with reference to FIG. 5. However, the numerical value of the voltage shown in the following description is an example, and is not limited to this. FIG. 5 is a plan view showing a current flow during read operation of the memory cell which is a semiconductor device according to the present embodiment.

The memory transistor Qm (see FIG. 3) configuring the memory cell according to the present embodiment has a MISFET structure, and the charge storage state of the trapping insulating film in the gate dielectric film of the MISFET is used as storage information, and the stored information is read out as the threshold voltage of the transistor. The trapping insulating film is an insulating film capable of storing charges, and as an example, a silicon nitride film or the like can be given. The threshold voltage of the MISFET is shifted by injecting and discharging charges into and from the charge storage portion to operate as a memory element.

Here, the selected memory cell is a memory cell selected as a target for performing "write", "erase" or "read". In the present embodiment, injection of electrons into the silicon nitride film NF (see FIG. 3), which is a charge storage portion in the ONO film C1 of the memory transistor Qm, is defined as "write" and injection of holes into the silicon nitride film NF is defined as "erase".

The write operation and the erase operation are performed by a method using FN (Fowler Nordheim) tunneling, which is called an FN method. In other words, the write of the FN system can be regarded as an operation method of writing the memory cell by injecting electrons into the silicon nitride film NF by the FN tunnel effect, and the erase of the FN method can be regarded as an operation method of erasing the memory cell by injecting holes into the silicon nitride film NF by the FN tunnel effect.

Voltages applied to the respective parts shown in FIGS. 1 to 3 in the respective operations of "write", "erase" and "read" will be exemplified below. Here, the voltage Vmg applied to the memory gate electrode MG of the selected memory cell, the voltage Vsg applied to the select gate electrode SG, the voltage Vsl applied to the source line (the source region S1 of the select transistor Qs), and the voltage Vbl applied to the bit line (the drain region D2 of the memory transistor Qm) will be described. Here, the voltage Vwell applied to the well WL, the voltage Vmgi applied to the dummy memory gate electrode MGI, and the voltage Vsgi applied to the dummy select gate electrode SGI will be described.

The voltages in the write operation are Vmg=8 V, Vsg=−2.5 V, Vsl=0 V, Vbl=−2.5 V, Vwell=−2.5 V, Vmgi=8 V, Vsgi=−2.5 V. By applying such voltages, in the memory transistor Qm of the selected memory cell, write is performed by tunneling electrons from the channel formation region of the memory transistor Qm (the well WL between the source region S2 and the drain region D2) and injecting the electrons into the silicon nitride film NF in the ONO film C1. At this time, electrons pass through the silicon oxide film X1 (see FIG. 3) from the channel formation region by FN tunneling (FN tunneling effect), are injected into the silicon nitride film NF, and are trapped by the trap levels of the silicon nitride film NF. In addition, holes are extracted from the silicon nitride film NF into the channel formation region by FN tunneling. As a result, the threshold voltage of the memory transistor Qm rises. Specifically, the threshold voltage of the memory transistor is higher than 0V. That is, the memory transistor Qm is in the write state.

The voltages in the erase operation are Vmg=−3.3 V, Vsg=3.3 V, Vsl=Vbl=Floating (High-Z), Vwell=6.6 V, Vmgi=−3.3 V, and Vsgi=3.3 V. That is, the source line and the bit line are set to an open-circuit voltage (floating state, high impedance state). By applying the voltages, in the memory transistor Qm of the selected memory cell, erase is performed by emitting the electron in the silicon nitride film NF to the channel formation region by the tunnel effect, and tunnel-injecting the holes from the channel formation region into the silicon nitride film NF. As a result, the threshold voltage of the memory transistor Qm decreases. Specifically, the threshold voltage of the memory transistor is lower than 0V. That is, the memory transistor Qm is in the erase state.

The voltages in the read operation are Vmg=0 V, Vsg=3.3 V, Vsl=0 V, and Vbl=1 V, Vwell=0 V, Vmgi=0 V, Vsgi=0 V. By setting the voltage Vmg applied to the memory gate electrode MG at the time of read to a voltage between the threshold voltage of the memory transistor Qm in the write state and the threshold voltage in the erase state, the write state and the erase state can be discriminated from each other by the current flowing through the memory cell. At the time of read, the dummy select gate electrode SGI and the dummy memory gate electrode MGI are turned off. As a result, a plurality of select gate electrodes SG or memory transistors Qm arranged on one active region which is not partitioned by the element isolation region EI can be used as elements which are isolated from each other.

In the read operation, the current path is as shown in FIG. 5. In FIG. 5, the flow of current during the read operation is shown by a thick arrow. Here, a current path in a memory cell formed in the second bit region 2B is shown as an example. As shown in FIG. 5, the current flows from the wiring MB, which is a bit line, to the wiring M2 through the drain region D2, the channel formation region, and the source region S2 of the memory transistor Qm in this order, and then flows from the wiring M2 through the drain region D1, the channel formation region, and the source region S1 of the select transistor Qs in this order to the wiring MS which is a source line.

Manufacturing Step of Semiconductor Device

Figure 6:
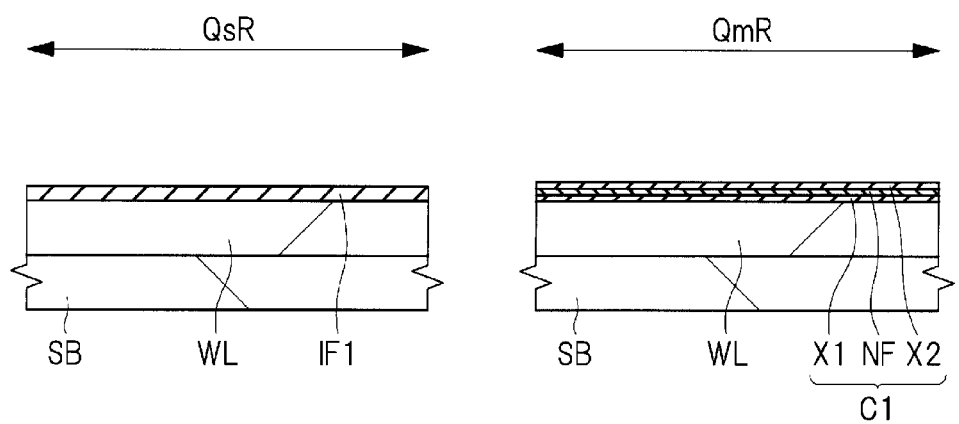
FIG. 6 is a cross-sectional view during a manufacturing step of the semiconductor device according to the first embodiment.
Figure 7:
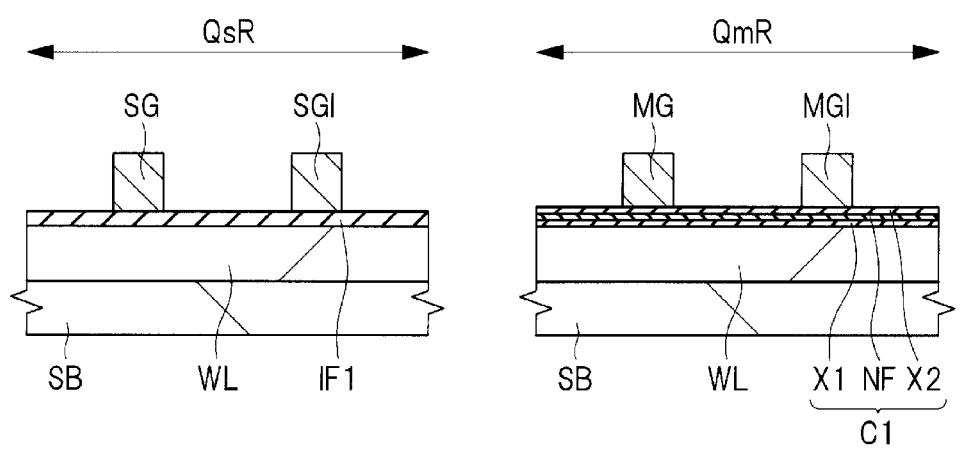
FIG. 7 is a cross-sectional view during the manufacturing step of the semiconductor device following FIG. 6.

Hereinafter, a manufacturing step of the semiconductor device according to the present embodiment will be described with reference to FIGS. 6 and 7. FIGS. 6 and 7 are a cross-sectional view showing a manufacturing step of a memory cell which is the semiconductor device according to the present embodiment. In FIGS. 6 and 7, the cross section of the first region QsR and the cross section of the second region QmR are shown side by side. Here, an ONO film and an I/O oxide film are separately formed, and a plurality of types of gate electrodes are formed from one polysilicon film.

First, as shown in FIG. 6, the semiconductor substrate SB made of, for example, p-type monocrystalline silicon (Si) is prepared. Subsequently, after a trench is formed in the upper surface of the semiconductor substrate SB, a silicon oxide film is embedded in the trench, thereby forming element isolation region (not shown) formed of the silicon oxide film.

Subsequently, p-type impurities (for example, B (boron)) are implanted into the upper surface of the semiconductor substrate SB by, for example, ion implantation method, thereby forming p-type well WL in the semiconductor substrate SB of each of the first region QsR and the second region QmR. If the base process conditions for mounting the memory are specifications convenient for the memory, the memory well WL and the n-type MOSFET well in the I/O region may be shared. The I/O (Input/Output) region is, for example, a region in which circuits and elements used for inputting and outputting signals between a semiconductor device (semiconductor chip) and an external device are formed. The MISFET formed in the I/O region requires high withstand voltage as compared with the elements configuring the logic circuits, and has a relatively thick gate dielectric film. Here, the thick gate dielectric film having the MISFET in the I/O region and the gate dielectric film of another region formed in the same step as the gate dielectric film are sometimes referred to as an I/O oxide film.

Subsequently, ion implantation is performed to form a channel region in the upper surface of the semiconductor substrate SB in the first region QsR. Here, p-type impurities (for example, B (boron)) are implanted into the upper surface of the semiconductor substrate SB. The channel region is a region in which a channel is formed during operation of the transistor, and has a depth shallower than that of the well WL. In the ion implantation step performed to form the channel region in the first region QsR, the channel region may be simultaneously formed in the region where the n-type MISFET is formed in the I/O region.

Subsequently, annealing is performed to activate the implanted impurities for forming the well WL and the channel region, respectively. Thereafter, a gate dielectric film IF1, which is an I/O oxide film covering the upper surface of the semiconductor substrate SB, is formed. In the oxidation step performed to form the I/O oxide film, for example, ISSG (In-Situ Steam Generation) oxidation is performed.

Then, a resist pattern exposing the upper surface of the semiconductor substrate SB in the second region QmR and a part of the upper surface of the semiconductor substrate SB in the first region QsR is formed on the gate dielectric film IF1 by photolithography technology. In the present embodiment, since the region for forming the select transistor and the region for forming the memory transistor are separately combined, the exposure apparatus including masks (reticles) for forming the resist pattern need not be highly accurate and may be used for rough patterns. That is, there is no need to use an exposure apparatus using a KrF excimer laser or the like capable of forming fine patterns.

Subsequently, using the resist pattern as a mask, ion implantation for forming a channel region in the second region QmR is performed. Here, p-type impurities (for example, B (boron)) is implanted into the upper surface of the semiconductor substrate SB. Subsequently, after the asking treatment, the gate dielectric film IF1 in the second region QmR is removed by wet etching using a chemical solution containing hydrofluoric acid, thereby exposing the upper surface of the semiconductor substrate SB. Subsequently, the resist pattern is removed.

Subsequently, a silicon oxide film X1, which is a bottom oxide film of the ONO film, is formed on the upper surface of the semiconductor substrate SB by using, for example, thermal oxidation method. Here, the thickness of the silicon oxide film X1 is, for example, about 2 nm, but may be less than or greater than 2 nm. Subsequently, a silicon nitride film NF is formed on the upper surface of the semiconductor substrate SB by, for example, CVD (Chemical Vapor Deposition) method. The nitride film may have a film thickness of, for example, about 10 nm, and may be a stacked film of a silicon nitride film formed of a film having a thickness of, for example, about 2 nm and a film having a thickness of, for example, about 3 nm. When the silicon nitride film NF is formed as a stacked film, an oxide layer is formed at the interface between the films configuring the stacked film. Subsequently, the surface of the nitride film is oxidized to form a silicon oxide film X2 which is a top oxide film of the ONO film. For example, ISSG oxide is used for the oxidation. Thus, the ONO film C1, which is a stacked film formed of the silicon oxide film X1, the silicon nitride film NF, and the silicon oxide film X2, is formed.

Next, a resist pattern covering the ONO film C1 in the second region QmR and exposing the ONO film C1 in the first region QsR is formed on the ONO film C1. In the present embodiment, since the region for forming the select transistor and the region for forming the memory transistor are separately combined, the exposure apparatus including masks (reticles) for forming the resist pattern need not be highly accurate and may be used for rough patterns. Subsequently, after the asking treatment is performed, the silicon oxide film X2 is patterned by wet etching using a chemical solution containing hydrofluoric acid. Subsequently, after the resist pattern is removed, a part of the silicon nitride film NF is removed using a chemical solution such as hot phosphoric acid using the silicon oxide film X2 as a mask. As a result, the ONO film C1 remains only in the second region QmR, and the gate dielectric film IF1 and the I/O oxide film are exposed in regions other than the second region QmR. Thus, the structure shown in FIG. 6 is obtained.

Next, as shown in FIG. 7, the I/O oxide film in the core device formation region (not shown) such as the logic circuit region is removed to expose the upper surface of the semiconductor substrate SB. Subsequently, a thin silicon oxide film is formed on the upper surface of the semiconductor substrate SB in the core device formation region. For example, ISSG oxidation is used for the oxidation. The silicon oxide film is used as a gate dielectric film of a transistor in the core device formation region.

Subsequently, a polysilicon film serving as gate electrodes is formed on the upper surface of the semiconductor substrate SB by, for example, CVD method. Subsequently, using the resist pattern as a mask, implantation of n-type impurities and implantation of p-type impurities into the polysilicon film are performed, respectively, and then annealing is performed. Subsequently, the gate electrodes are processed. Here, the polysilicon film in each of the first region QsR and the second region QmR is patterned using photolithography technique and etching method. Thus, the select gate electrodes SG and the dummy select gate electrodes SGI formed of the polysilicon film are formed in the first region QsR, and the memory gate electrodes MG and the dummy memory gate electrodes MGI formed of the polysilicon film are formed in the second region QmR. In the logic circuit region, gate electrodes (not shown) are formed by patterning the polysilicon film.

After the respective gate electrodes are patterned in the etching step, the gate dielectric film IF1 and the ONO film C1 may be patterned successively. However, when the insulating films are patterned by the same etching process while the gate dielectric film of the logic circuit region thinner than the gate dielectric film IF1 and the ONO film C1 is exposed, the upper surface of the semiconductor substrate SB is excessively scraped off at the portion where the thin gate dielectric film in the logic circuit region is removed. Therefore, in the etching step, after the gate electrodes are patterned, the gate dielectric film IF1 and the ONO film C1 are not etched, and the upper surface of the semiconductor substrate SB is not exposed, thereby preventing the surfaces of the semiconductor substrate SB in the active regions from being excessively scraped.

That is, immediately after the select gate electrodes SG and the memory gate electrodes MG are formed, the active region of the logic circuit region is covered with the thin gate dielectric film, the active region of the first region QsR is covered with the gate dielectric film IF1, the active region of the second region QmR is covered with the ONO film C1, and the active region of the I/O region is covered with the thick gate dielectric film (I/O oxide film). Thus, the surface of the semiconductor substrate SB can be protected from being etched. Thus, the structure shown in FIG. 7 is obtained.

In the present embodiment, since the formation region of the select transistors and the formation region of the memory transistors are separately combined, the ONO film C1 does not terminate in a narrow region such as a region between the gate electrodes adjacent to each other in the gate length direction, as in the compared example (see FIGS. 12 and 13) to be described later. Therefore, the exposure apparatus including masks (reticles) for forming the resist pattern does not need to have high accuracy, and a rough resist pattern can be used.

Next, as shown in FIG. 3, n-type impurity ions are implanted into the upper surface of the semiconductor substrate SB in the second region QmR to form an extension region (not shown). Here, a resist pattern covering the first region QsR and exposing the second region QmR is formed on the semiconductor substrate SB, and ion implantation is performed using the resist pattern as a mask to form a pair of extension regions so as to sandwich the channel region under the memory gate electrode MG. Thereafter, dry etching is performed using the resist pattern as a mask to remove a part of the ONO film C1, thereby exposing the upper surface of the semiconductor substrate SB. That is, the ONO film C1 remains only under each of the memory gate electrode MG and the dummy memory gate electrode MGI. Subsequently, the resist pattern is removed.

Here, since the ONO film C1 is exposed using the resist pattern for forming the extension region in the second region QmR, the processing region of the ONO film C1 can be limited to only the second region QmR. Therefore, it is possible to select an etching condition for minimizing the scraping of the surface of the semiconductor substrate SB in the active region caused by the dry etching of the ONO film C1, and to perform ion implantation under an optimum condition as a condition for forming the extension regions in the second region QmR.

Subsequently, as shown in FIG. 2, n-type impurity ions are implanted into the upper surface of the semiconductor substrate SB in the first region QsR to form extension regions (not shown). Here, a resist pattern covering the second region QmR and exposing the first region QsR is formed on the semiconductor substrate SB, and ion implantation is performed using the resist pattern as a mask to form a pair of extension regions so as to sandwich the channel region under the select gate electrode SG. Thereafter, dry etching is performed using the resist pattern as a mask to remove a part of the gate dielectric film IF1, thereby exposing the upper surface of the semiconductor substrate SB. The gate dielectric film IF1 remains only under the select gate electrode SG and the dummy select gate electrode SGI. Subsequently, the resist pattern is removed. The exposure apparatus including masks (reticles) for forming the resist pattern need not be highly accurate and can be used for rough patterns.

Here, since the gate dielectric film IF1 is exposed using the resist pattern for forming the extension region in the first region QsR, the processing region of the gate dielectric film IF1 can be limited to only the first region QsR. Therefore, it is possible to select an etching condition for minimizing the scraping of the surface of the semiconductor substrate SB in the active region caused by the dry etching of the gate dielectric film IF1, and to perform ion implantation under an optimum condition as a condition for forming the extension region in the first region QsR.

In the step of forming the extension region, extension regions of a MISFET in the I/O region may be formed at the same time. As a result, the number of masks to be used can be reduced, and the manufacturing cost can be reduced. The extension regions may be formed in the first region QsR and the second region QmR by the same implantation step using the same resist pattern, and the gate dielectric film IF1 and the ONO film C1 may be simultaneously removed by the etching process using the resist pattern as a mask.

As described above, by etching using the plurality of resist patterns formed to form the extension regions in the respective regions as masks, the thin gate dielectric film in the logic circuit region, the gate dielectric film IF1 in the first region QsR, and the ONO film C1 in the second region QmR can be patterned by separate processes. This prevents the semiconductor substrate from being excessively etched away in regions where the gate dielectric film is thinner than the gate dielectric film in other regions.

Next, as shown in FIGS. 2 and 3, sidewall spacers SW are formed to cover the respective side surfaces of the select gate electrode SG, the dummy select gate electrode SGI, the memory gate electrode MG, and the dummy memory gate electrode MGI. The sidewall spacers SW can be formed in a self-aligned manner by, for example, forming a stacked insulating film formed of a silicon oxide film and a silicon nitride film on the semiconductor substrate SB by CVD method, etching back the stacked insulating film, and exposing the gate electrodes and the upper surface of the semiconductor substrate SB from the stacked insulating film.

Subsequently, n-type impurity ions are implanted into the upper surface of the semiconductor substrate SB to form diffusion regions of the source regions S1 and S2 and the drain regions D1 and D2, respectively. As a result, the source regions S1 and S2 and the drain regions D1 and D2 formed of the above-described extension regions and the diffusion regions are formed. The diffusion region is an n-type semiconductor region having an impurity concentration higher than that of the extension region. In FIG. 2 and FIG. 3, the diffusion region and the extension region which are in contact with each other are not shown separately, but are shown as being integrated. The source region S1 and the drain region D1, and the select gate electrode SG on the semiconductor substrate SB between the source region S1 and the drain region D1 configure the select transistor Qs. The source region S2 and the drain region D2, and the memory gate electrode MG on the semiconductor substrate SB between the source region S2 and the drain region D2 configure the memory transistor Qm.

Subsequently, silicide layers (not shown) are formed on the exposed upper surface of the semiconductor substrate SB and the upper surface of the gate electrodes using salicide process. Subsequently, an interlayer insulating film IL1 formed of, for example, a silicon oxide film is formed on the semiconductor substrate SB via a liner insulating film (not shown) formed of a silicon nitride film, and then the upper surface of the interlayer insulating film IL1 is flattened by, for example, CMP (Chemical Mechanical Polishing) method. Subsequently, a plurality of contact holes penetrating the interlayer insulating film IL1 are formed by photolithography and dry etching. Subsequently, plugs PG are formed in the contact holes by embedding the contact holes with a conductive film mainly made of W (tungsten), for example.

Subsequently, an interlayer insulating film IL2 formed of, for example, a silicon oxide film is formed on the interlayer insulating film IL1 and the plugs PG. Thereafter, wiring trenches that penetrate through the interlayer insulating film IL2 and expose the upper surface of the plugs PG are formed in the interlayer insulating film IL2 by photolithography and etching. Subsequently, wirings M1 made of, for example, Cu (Copper) are formed in the wiring trenches. The wirings M1 is formed by, for example, so-called single damascene method.

Thereafter, a plurality of wiring layers are stacked on the first wiring layer formed of the wirings M1 and the interlayer insulating film IL2. As a result, the drain region D1 of the select transistor Qs in the first region QsR and the source region S1 of the memory transistor Qm in the second region QmR are electrically connected to each other via the plugs PG and the wiring M1. The wiring for connecting the select transistor Qs and the memory transistor Qm may use not only the wiring M1 but also the wiring over the wiring M1. As described above, a plurality of memory cells including the select transistor Qs and the memory transistor Qm connected to each other are formed in the memory array. Thus, the structure shown in FIGS. 1 to 3 is obtained.

Effect of Present Embodiment

Figure 12:
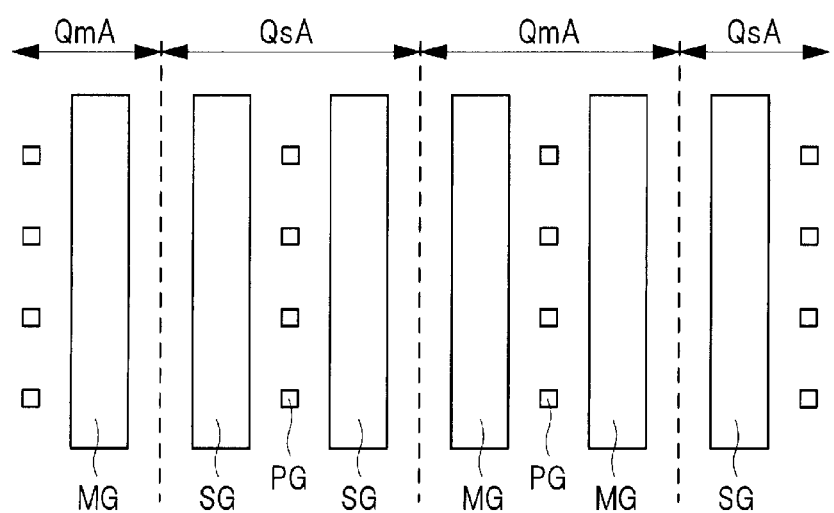
FIG. 12 is a plan view of a semiconductor device according to compared example.
Figure 13:
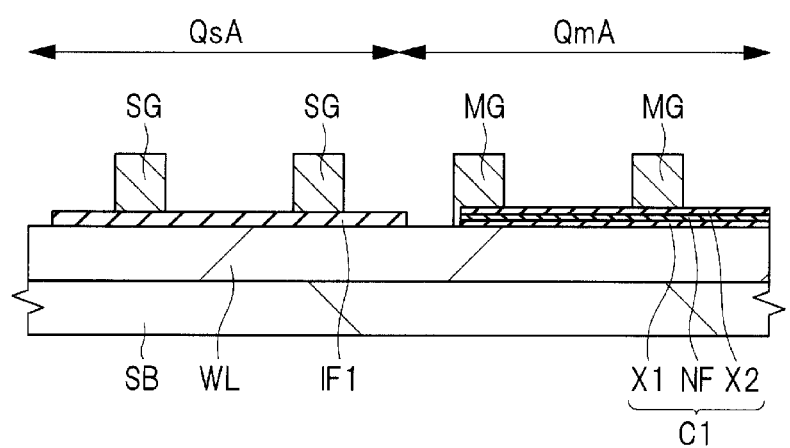
FIG. 13 is a cross-sectional view during a manufacturing step of the semiconductor device according to the compared example.

The effect of the present embodiment will be described with reference to FIGS. 12 and 13. FIG. 12 is a plan view of a semiconductor device according to a compared example. FIG. 13 is a cross-sectional view during a manufacturing step of the semiconductor device according to the compared example. In FIG. 12, only gate electrodes and plugs are mainly shown, and element isolation region, interlayer insulating film, sidewall spacers, wiring layers, and the like are not shown.

As shown in the planar layout of FIG. 12, the semiconductor device of the compared example is the same as the semiconductor device of the present embodiment in that the compared example has a plurality of memory cells each configured to the select transistor Qs and the memory transistor Qm connected to each other. However, a third region QsA (corresponding to the first region QsR in FIG. 1) which is a region in which the select transistors Qs are formed and a fourth region QmA (corresponding to the second region QmR in FIG. 1) which is a region in which the memory gate electrodes MG of the memory transistors Qm connected to the select transistor Qs are formed are arranged in the gate length direction of each of the select transistors Qs and the memory transistors Qm. In this respect, the compared example differs from the semiconductor device of the present embodiment.

In other words, in the third region QsA, the select gate electrode SG extending in the Y direction is formed on the semiconductor substrate via the gate dielectric film (not shown). In one third region QsA, two select gate electrodes SG are arranged side by side in the X direction. In the fourth region QmA, the memory gate electrode MG extending in the Y direction is formed on the semiconductor substrate via the ONO film (not shown). In one fourth region QmA, two memory gate electrodes MG are arranged side by side in the X direction.

In the X direction, the plug PG formed at the center of the third region QsA is electrically connected to the source region of the select transistor Qs. In the X direction, the plug PG formed at the center of the fourth region QmA is electrically connected to the drain region of the memory transistor Qm. On the other hand, a plug is not formed between the select gate electrode SG and the memory gate electrode MG facing each other in the X direction across the boundary between the third region QsA and the fourth region QmA. That is, the plug is not connected to the drain region of the select transistor Qs and the source region of the memory transistor Qm. The drain region of the select transistor Qs and the source region of the memory transistor Qm are formed of the same n-type semiconductor region. That is, the select transistor Qs and the memory transistor Qm of the compared example are electrically connected to each other by sharing the semiconductor region which is the drain region of the select transistor Qs and the source region of the memory transistor Qm without interposing the plugs and the wiring.

In the third region QsA, two select transistors Qs are arranged side by side in the X direction, and in the fourth region QmA, two memory transistors Qm are arranged side by side in the X direction. The third region QsA and the fourth region QmA are alternately arranged in the X direction.

In such a manufacturing step of the semiconductor device, as shown in FIG. 13, the gate dielectric film IF1 is formed on the semiconductor substrate SB in the third region QsA by performing the same step as the step described with reference to FIG. 6, and thereafter, the ONO film C1 is formed on the semiconductor substrate SB in the fourth region QsA. That is, the gate dielectric film IF1 formed on the semiconductor substrate SB is processed using photolithography technique and etching method to expose the semiconductor substrate SB in the fourth region QmA. Subsequently, after forming the ONO film C1 on the semiconductor substrate SB and the gate dielectric film IF1, the ONO film C1 is processed by photolithography and etching method to remove the ONO film C1 in the third region QsA.

Subsequently, the same step as that described with reference to FIG. 7 is performed. After depositing a polysilicon film on the semiconductor substrate SB, the polysilicon film is processed using photolithography and etching method. Thus, the select gate electrodes SG are formed on the gate dielectric films IF1 in the third region QsA, and the memory gate electrodes MG are formed on the ONO films C1 in the fourth region QsA. Thus, the structure shown in FIG. 13 is obtained.

Although not shown, the subsequent steps are performed in the same manner as present embodiment. That is, the extension regions are formed using the resist and the mask, and the gate dielectric films IF1 and the ONO films C1 exposed from the select gate electrodes SG and the memory gate electrodes MG are removed using the resist as a mask. Thereafter, sidewall spacers and diffusion regions are formed to form source and drain regions. Subsequently, interlayer insulating films, plugs and wiring layers are formed over the semiconductor substrate SB, thereby forming the semiconductor device of the compared example. However, the select transistor Qs and the memory transistor Qm (see FIG. 12) are connected to each other without the wiring.

Here, in the step described with reference to FIG. 13, the gate dielectric films IF1 and the ONO films C1 need to be separately formed so as to be separated from each other across the boundaries between the third regions QsA and the fourth regions QmA. This forming is performed using photolithography technique. As described above, processing for forming the select gate electrodes SG and the memory gate electrodes MG is also performed using photolithography technique. In a step of patterning by etching method using photolithography technique, a resist pattern formed by exposing and developing a resist film coated on the semiconductor substrate SB is used as a mask to process the gate dielectric film IF1, the ONO film C1 or the polysilicon film. Due to a shift in the position of the mask (reticle) or the like in the exposure process, the exposure position may shift, and the positions and dimensions of the gate dielectric films IF1, the ONO films C1, the select gate electrodes SG, and the memory gate electrodes MG may shift.

When the shift in the X direction becomes excessively large, a part of the select gate electrode SG may be formed outside the end portion of the gate dielectric film IF1, or a part of the memory gate electrode MG may be formed outside the end portion of the ONO film C1. FIG. 13 shows a configuration in which a part of one of the memory gate electrodes MG is not formed on the ONO film C1 and is in contact with the upper surface of the semiconductor substrate SB next to the ONO film C1. In this case, the breakdown voltage between the select gate electrode SG and the semiconductor substrate SB or the breakdown voltage between the memory gate electrode MG and the semiconductor substrate SB is lowered.

On the other hand, if a distance between the gate dielectric film IF1 and the ONO film C1 in the X direction in the structure shown in FIG. 13 is shortened, it appears that a decrease in breakdown voltage due to positional shift of the gate electrodes and the like as described above can be prevented. However, there is a possibility that the ONO film C1 remains overlapped on the gate dielectric film IF1 due to the shift of the exposure position in the photolithography process. When the ONO film C1 remains overlapping on the gate dielectric film IF1, if the select gate electrode SG or the memory gate electrode MG is formed on the ONO film C1, the characteristics of the select transistor Qs or the memory transistor Qm change, and the semiconductor device does not operate normally.

Further, by increasing the distance between the select gate electrode SG and the memory gate electrode MG arranged across the boundary between the third region QsA and the fourth region QmA, the distance between the select gate electrode SG and the end portion of the gate dielectric film IF1 and the distance between the memory gate electrode MG and the end portion of the ONO film C1 can be sufficiently ensured, and it appears that the above-mentioned problems of the decrease of the withstand voltage due to the positional shift of the exposure can be prevented. However, this increases the area occupied by the memory array and increases a size of the semiconductor device.

That is, in the semiconductor device of the compared example, since the select transistor Qs and the memory transistor Qm configuring the memory cell are arranged in the gate length direction, it is difficult to prevent an increase in the area of the semiconductor device and to prevent a decrease in the reliability of the memory cell. In addition, there is a problem that a margin for the shift of the exposure position is small and the yield is lowered.

Therefore, in the present embodiment, as shown in FIG. 1, the select transistors Qs and the memory transistors Qm are collectively formed in separate regions, respectively, and the select transistors Qs and the memory transistors Qm configuring the memory cells are electrically connected via wirings.

In this manner, by collectively forming the select transistors Qs and the memory transistors Qm in separate regions, the sizes of the patterns and the distances between the patterns such as the gate electrodes and the gate dielectric films can be increased, and the control at the boundaries between the patterns becomes less strict. Therefore, the distances between end of the gate electrode and end of the gate dielectric film and between end of the gate dielectric film IF1 and end of the ONO film C1 facing each other can be ensured to be large. Therefore, as shown in FIG. 13, it can be prevented that a part of the gate electrode (select gate electrode SG or memory gate electrode MG) is formed on the outer side of the gate dielectric film. In addition, it is possible to prevent the ONO film C1 from remaining on the gate dielectric film IF1.

Here, the first region QsR in which the plurality of select transistors Qs are formed and the second region QmR in which the plurality of memory transistors Qm are formed are arranged in the gate width direction (Y direction) of these transistors. As a result, the select gate electrode SG and the memory gate electrode MG facing each other across the boundary between the first region QsR and the second region QmR can be terminated on the element isolation region EI. That is, in the compared example, the boundary portion for forming the ONO film and the I/O oxide film exists on the active region, whereas in the present embodiment, the boundary portion for forming the ONO film and the I/O oxide film exists only on the element isolation region EI (see FIG. 4). Therefore, even if a part of the gate electrode is formed on the outer side of the gate dielectric film, the part of the gate electrode is not in contact with the upper surface of the semiconductor substrate SB but in contact with the upper surface of the element isolation region EI.

Further, as in the compared example shown in FIG. 13, when gate dielectric film (gate dielectric film IF1 or ONO film C1) is processed, it is considered that polysilicon or gate dielectric film residues are generated in the terminal portion (step portion) of the gate dielectric film along with the processing. If such a residue remains on the surface of the active region, the breakdown voltage between the gate electrode and the semiconductor substrate is lowered. On the other hand, in the present embodiment, the end portion of the gate dielectric film in the gate width direction (Y direction) can be terminated on the element isolation region EI (see FIG. 4). Therefore, even if the above-mentioned residue is generated, it is possible to prevent the effect from being generated by the residue.

As described above, it is possible to prevent the breakdown voltage between the select gate electrode SG and the memory gate electrode MG and the semiconductor substrate SB from decreasing, so that the reliability of the semiconductor device can be improved.

In addition, since the select transistor Qs and the memory transistor Qm configuring one memory cell (bit) are arranged in the gate width direction (Y direction) of the gate electrodes of these transistors, the wiring connecting the select transistor Qs and the memory transistor Qm to each other can be connected with the shortest distance. In other words, miniaturization, low resistivity, and power saving of the semiconductor device can be realized. Specifically, the select gate electrode SG of the select transistor Qs and the memory gate electrode MG of the memory transistor Qm are arranged in the Y direction, the source region S1 of the select transistor Qs and the drain region D2 of the memory transistor Qm are arranged in the Y direction, and the drain region D1 of the select transistor Qs and the source region S2 of the memory transistor Qm are arranged in the Y direction.

In the present embodiment, even if the base process is a leading-edge process of, for example, several tens of nanometers, the specification of masks (reticles) required for forming the memory cells may be a specification for forming rough patterns such as linear patterns (I lines). This facilitates patterning and reduces the cost of adding masks and adding photolithography process, respectively. In addition, it is possible to prevent the yield from decreasing due to misalignment of the exposure position or the like. In addition, since the pattern can be easily formed, the man-hour required for completing the new memory mixed mounting work can be reduced.

In the present embodiment, as shown in FIGS. 1 to 3, dummy select gate electrodes SGI arranged with the select gate electrodes SG in the first region QsR and dummy memory gate electrodes MGI arranged with the memory gate electrodes MG in the second region QmR are formed. As a result, it is not necessary to separate the select transistors Qs arranged in the X direction (gate length direction) from each other by the element isolation region EI, and it is not necessary to separate the memory transistors Qm arranged in the X direction (gate length direction) from each other by the element isolation region EI.

Therefore, the active region defined by the element isolation region EI is configured only by a layout in which a plurality of patterns extending in the X direction are arranged in the Y direction. That is, the layout of the active region can be simplified. Therefore, the specification of the mask (reticle) necessary for forming the active region of the memory cell may be a specification for forming a rough pattern such as a linear pattern (I line). This facilitates patterning and reduces semiconductor device manufacturing costs. Further, by simplifying the layout of the active region, it is possible to prevent the reliability of the semiconductor device and the yield of the semiconductor device from being lowered due to the shift of the exposure position.

Second Embodiment

Figure 8:
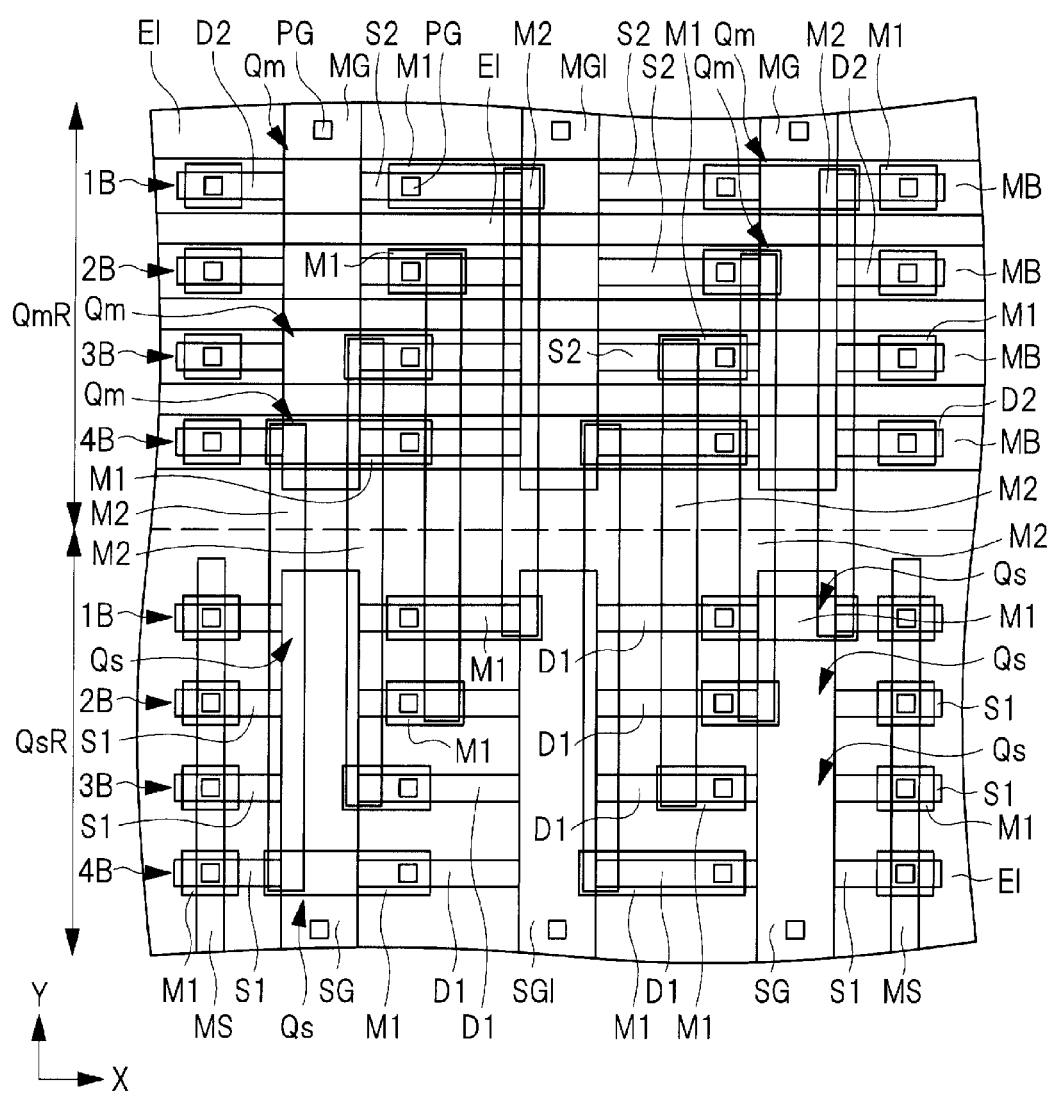
FIG. 8 is a plan view of a semiconductor device according to second embodiment.

With reference to FIG. 8, in the semiconductor device where a plurality of wirings for connecting the select transistors and the memory transistors are provided, the reduction of the difference in resistance values (resistance difference) between the wirings will be described. FIG. 8 is a plan view of the semiconductor device according to the second embodiment. Since the cross-sectional structure of the semiconductor device of the present embodiment is substantially the same as the cross-sectional structure shown in FIGS. 2 and 3, the explanation of the cross-sectional structure is omitted here.

In the first embodiment, the wiring connecting the select transistor Qs and the memory transistor Qm may not include the wiring M2, but as shown in FIG. 8, in the semiconductor device of the present embodiment, the wiring connecting the select transistor Qs and the memory transistor Qm includes the wirings M1 and M2. Further, in comparison with the first embodiment, here, in the X direction, a length of each of the select gate electrode SG, the dummy select gate electrode SGI, the memory gate electrode MG, and the dummy memory gate electrode MGI, and a distance between the gate electrodes adjacent to each other are large. Further, unlike the first embodiment, here, the plurality of wirings M2 connecting the plurality of select transistors Qs arranged in the Y direction and the plurality of memory transistors Qm arranged in the Y direction have the same length in the Y direction. The plurality of wirings M2 connecting the plurality of select transistors Qs arranged in the Y direction and the plurality of memory transistors Qm arranged in the Y direction are arranged in the X direction over the boundary line between the first region QsR and the second region QmR. In addition, unlike the first embodiment, the wiring connecting the select transistor Qs and the memory transistor Qm does not have a plane layout symmetrical with respect to the axis of the boundary between the first region QsR and the second region QmR.

Here, in the first region QsR and the second region QmR adjacent to each other, the distance between the first bit region 1B in the first region QsR and the first bit region 1B in the second region QmR and the distance between the second bit region 2B in the first region QsR and the second bit region 2B in the second region QmR are the same. In the first region QsR and the second region QmR adjacent to each other, the distance between the third bit region 3B in the first region QsR and the third bit region 3B in the second region QmR and the distance between the fourth bit region 4B in the first region QsR and the fourth bit region 4B in the second region QmR are the same. In the first region QsR and the second region QmR adjacent to each other, the distance between the second bit region 2B in the first region QsR and the second bit region 2B in the second region QmR and the distance between the third bit region 3B in the first region QsR and the third bit region 3B in the second region QmR are the same. That is, the distances in the Y direction between the corresponding bit regions in the first region QsR and the second region QmR adjacent to each other are the same.

This is because the first bit region 1B, the second bit region 2B, the third bit region 3B, and the fourth bit region 4B in the second region QmR, and the first bit region 1B, the second bit region 2B, the third bit region 3B, and the fourth bit region 4B in the first region QsR, are arranged in order in the Y direction. That is, the memory transistor Qm in the first bit region 1B, the memory transistor Qm in the second bit region 2B, the memory transistor Qm in the third bit region 3B, the memory transistor Qm in the fourth bit region 4B, the select transistor Qs in the first bit region 1B, the select transistor Qs in the second bit region 2B, the select transistor Qs in the third bit region 3B, and the select transistor Qs in the fourth bit region 4B are arranged in order in the Y direction. For this reason, the select transistor Qs in the first bit region 1B and the memory transistor Qm in the second bit region 2B are located between the select transistor Qs in the second bit region 2B and the memory transistor Qm in the first bit region 1B arranged in the Y direction, so that among the mutual bits, the distances in the Y direction between the select transistors Qs or the memory transistors Qm connected to each other can be equalized. Therefore, the resistances of the wirings for connecting the select transistors Qs or the memory transistors Qm to each other can be equalized between the respective bits, and variations in the resistance values can be prevented. That is, it is possible to prevent a difference in the amount of the current during read operation from occurring due to the difference in the resistance of the wiring of the respective memory cells.

In this manner, it is possible to reduce the difference in characteristics between memory cells in which the state of write or erase is the same (the difference in read current value caused by the difference in resistance). That is, the bit characteristic distribution in the memory array can be narrowed. By reducing the difference in the read current value, it is possible to prevent the memory cell from being erroneously determined to be in the erase state when reading the memory cell in the write state, for example. In order to prevent such erroneous read, it is not necessary to set a large difference between the threshold voltage of the memory cell in the erase state and the threshold voltage of the memory cell in the write state.

Here, it is required to arrange four wiring M2 arranged in the X direction in a region overlapping two gate electrodes adjacent to each other in the X direction and a region between the gate electrodes in plan view. Therefore, it is impossible to arrange the gate electrodes of minimum dimension in the X direction side by side with the minimum dimension. Therefore, the present embodiment can be suitably applied to a semiconductor device in which the length of the gate electrode in the X direction (gate length direction) is large and the width of the wiring in the X direction and the distance between the wirings are small.

Third Embodiment

Figure 9:
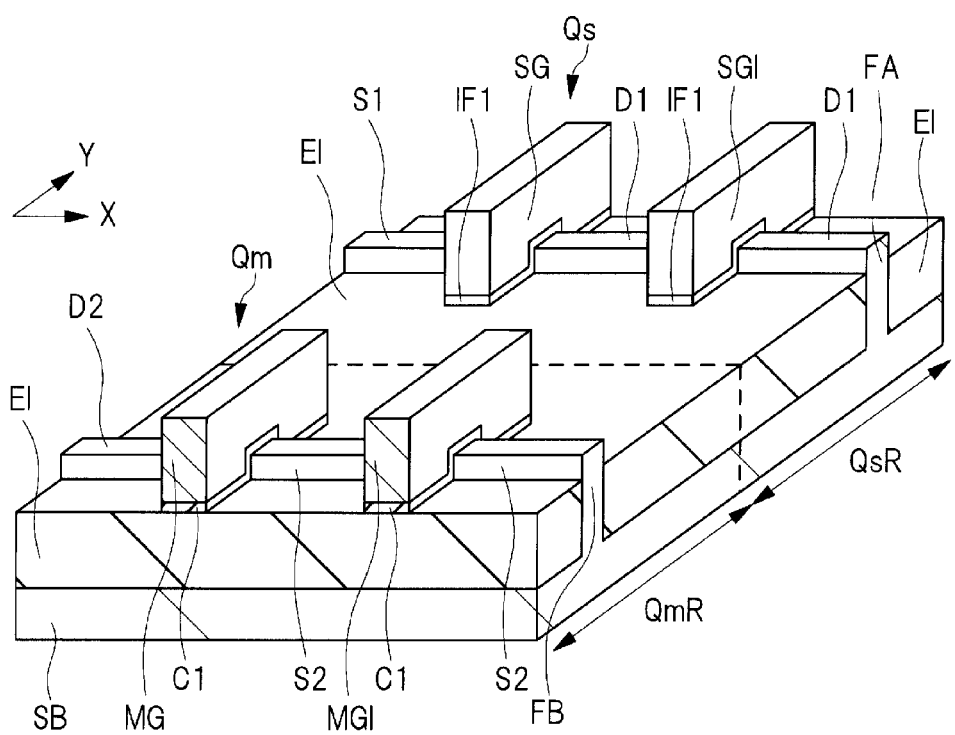
FIG. 9 is a perspective view of a semiconductor device according to third embodiment.
Figure 10:
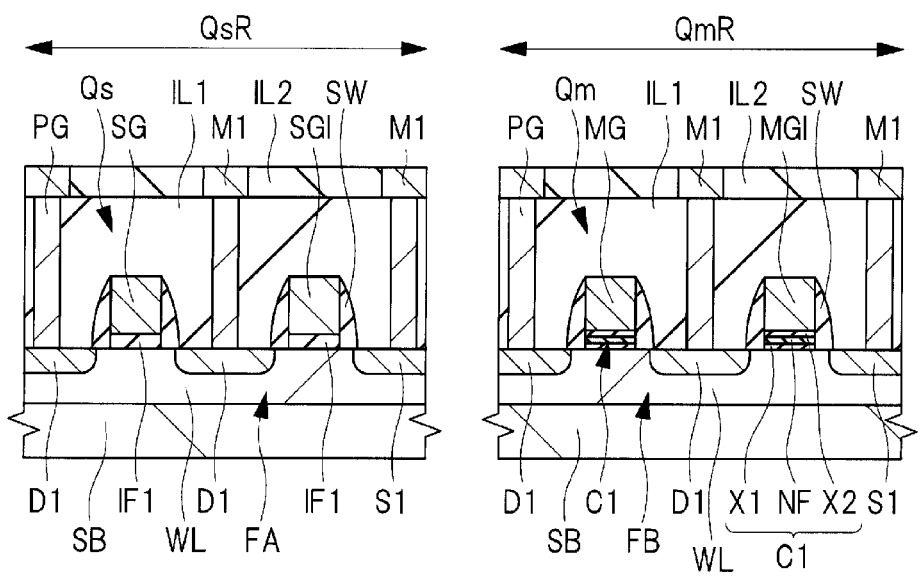
FIG. 10 is a cross-sectional view of the semiconductor device according to the third embodiment.
Figure 11:
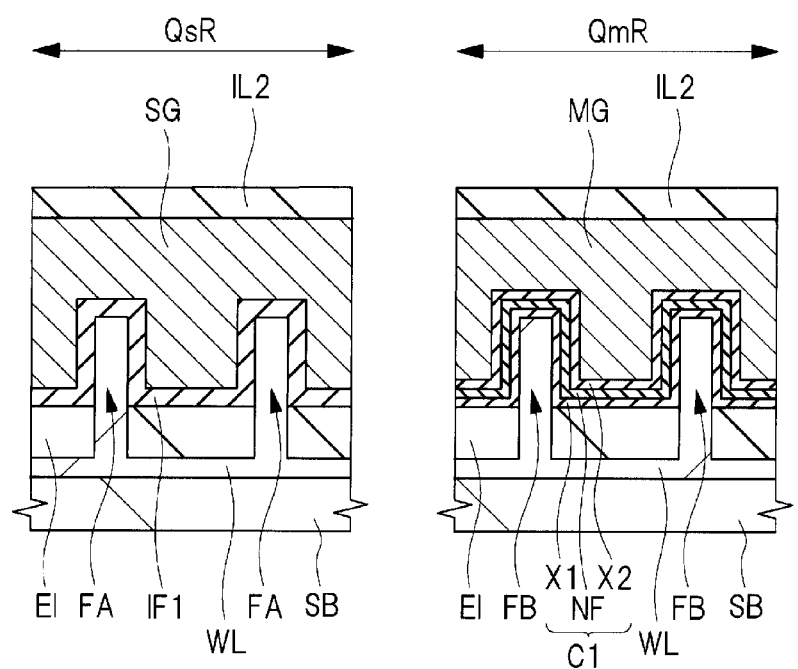
FIG. 11 is a cross-sectional view of the semiconductor device according to the third embodiment.

The first embodiment and the second embodiment can be applied to a memory cell configured by a fin-type transistor. Hereinafter, the structure of the memory cell of the present third embodiment configured by the fin-type transistor will be described with reference to FIG. 9 to FIG. 11. FIG. 9 is a perspective view of the semiconductor device according to the present embodiment. FIG. 10 and FIG. 11 are cross-sectional views of the semiconductor device according to the present embodiment. In FIG. 9, the boundary between the first region QsR and the second region QmR is shown by a broken line. In FIG. 10 and FIG. 11, the first region QsR is shown on the left side, and the second region QmR is shown on the right side.

The planar layout of the memory array of the present embodiment is similar to the planar layout shown in FIG. 1. However, all the active regions of the memory array including the first region QsR and the second region QmR are formed of fins protruded from the semiconductor substrate SB and extending in the X direction. FIG. 10 shows a cross section along the X direction (the gate length direction of the transistor), and the cross-sectional view of FIG. 10 includes the select gate electrode SG and the memory gate electrode MG. FIG. 11 shows a cross section along the Y direction (the gate width direction of the transistor), and the cross-sectional view of FIG. 11 includes the select gate electrode SG and the memory gate electrode MG.

As shown in FIG. 9 to FIG. 11, in the first region QsR, a plurality of fins FA extending in the X direction are arranged at equal distances in the Y direction. The fins FA are, for example, rectangular parallelepiped protruding portions selectively protruded from the upper surface (main surface) of the semiconductor substrate SB, and have wall-like (plate-like) shapes. The fins FA are part of the semiconductor substrate SB and configure the active regions of the semiconductor substrate SB. In plan view, the space between the fins FA adjacent to each other is embedded with an element isolation region (element isolation film, element isolation insulating film) EI, and the periphery of the fin FA is surrounded by the element isolation region EI.

The lower end portions of the fins FA are surrounded by the element isolation regions EI covering the upper surface of the semiconductor substrate SB in plan view. However, a part including the upper end portion of the fin FA protrudes from the element isolation region EI. That is, not all the spaces between the fins adjacent to each other are completely embedded with the element isolation regions EI.

A plurality of select gate electrodes SG extending in the Y direction are arranged on the plurality of fins FA via the gate dielectric films IF1. The select gate electrodes SG cover the upper surface and side surfaces of the fins FA. A drain region D1 and a source region S1 are formed in the fin FA including the upper surface and the side surfaces of the fin FA so as to sandwich the select gate electrode SG in plan view. The drain region D1 and the source region S1 are n-type semiconductor regions. The select gate electrode SG, the source region S1, and the drain region D1 configure a select transistor Qs.

Similar to the first embodiment, a dummy select gate electrode SGI is arranged adjacent to the select gate electrode SG so as to sandwich the drain region D1 in plan view. The dummy select gate electrode SGI has a structure similar to the structure of the select gate electrode SG, and the dummy select gate electrode SGI is formed on the fin FA via the gate dielectric film IF1. Side surfaces of each of the select gate electrode SG and the dummy select gate electrode SGI are covered with sidewall spacers SW.

In the second region QmR, similarly to the fin FA of the first region QsR, a plurality of fins FB extending in the X direction are arranged at equal distances in the Y direction. In plan view, a space between the fins FB adjacent to each other is embedded with the element isolation region (element isolation film, element isolation insulating film) EI, and a part including an upper end of the fin FB protrudes from the element isolation region EI.

A plurality of memory gate electrodes MG extending in the Y direction are arranged on the plurality of fins FB via the ONO films C1. The memory gate electrodes MG cover the upper surface and the side surfaces of the fins FB. A source region S2 and a drain region D2 are formed in the fin FB including the upper surface and the side surfaces of the fin FB so as to sandwich the memory gate electrode MG in plan view. The source region S2 and the drain region D2 are n-type semiconductor regions. The memory gate electrode MG, the source region S2, and the drain region D2 configure a memory transistor Qm.

Similar to the first embodiment, a dummy memory gate electrode MGI is arranged adjacent to the memory gate electrode MG so as to sandwich the source region S2 in plan view. The dummy memory gate electrode MGI has the same structure as the memory gate electrode MG, and is formed on the fin FB via the ONO film C1. Side surfaces of each of the memory gate electrode MG and the dummy memory gate electrode MGI are covered with sidewall spacers SW.

Similarly to the first embodiment, an interlayer insulating film IL1 is formed so as to cover the select transistor Qs or the memory transistor Qm, and a plurality of plugs PG penetrating the interlayer insulating film IL1 are electrically connected to the select gate electrodes SG, the dummy select gate electrodes SGI, the memory gate electrodes MG, the dummy memory gate electrodes MGI, the source regions S1 and S2, and the drain regions D1 and D2, respectively. The fins FA and FB are covered with the interlayer insulating film IL1. In FIG. 9, wells, sidewall spacers, plugs, interlayer insulating films, and wirings are not shown. In FIG. 9, the ONO film C1 having a stacked structure is shown as one film. The plugs connected to the respective gate electrodes are provided at locations not shown in FIG. 10 and FIG. 11.

Each of the fins FA, FB is, for example, a rectangular parallelepiped protruding portion that protrudes from the upper surface of the semiconductor substrate SB in a perpendicular direction to the upper surface. Each of the fins FA and FB does not necessarily have to be a rectangular parallelepiped, and corner portions, which are both end portions of the upper surface, may be rounded in a cross-sectional view along the short side. Also, the side surfaces of each of the fins FA and FB may be perpendicular to the upper surface of the semiconductor substrate SB, but may have angles of inclination close to perpendicular. That is, the cross-sectional shape of each of the fins FA and FB is a rectangular parallelepiped, or a trapezoid having a width larger at the lower end portion than at the upper end portion. The select gate electrodes SG and the dummy select gate electrodes SGI extend in the Y direction so as to straddle the fins FA, and the memory gate electrodes MG and the dummy memory gate electrodes MGI extend in the Y direction so as to straddle the fins FB.

As shown in FIG. 1, a direction (X direction) in which the fins FA and FB extend in plan view is a long side direction of each fin, and a direction (Y direction) orthogonal to the long side direction is a short side direction of each fin. That is, the length of the fin is greater than the width of the fin. The fins FA and FB may have any shape as long as they are protruding portions having lengths, widths, and heights. For example, it may have a serpentine layout in plan view.

A well WL, which is a p-type semiconductor region, is formed in the fin FA from the upper surface of the fin FA to the semiconductor substrate SB under the fin FA. The well WL is a region in which p-type impurities (for example, boron (B)) is introduced into the semiconductor substrate SB. The depth of the well WL is deeper than the depth of any of the source regions S1 and S2 and the drain regions D1 and D2.

A plurality of wirings M1 (refer to FIG. 10) are formed on the interlayer insulating film IL1, and the plurality of wirings M1 are electrically connected to the select gate electrodes SG, the dummy select gate electrodes SGI, the memory gate electrodes MG, the dummy memory gate electrodes MGI, the source regions S1 and S2, and the drain regions D1 and D2, respectively, via the plugs PG. Although not shown, a stack wiring layer including stacked wirings M2, MB, and MS is formed on the wiring M1 (refer to FIG. 1). Each of the select transistors Qs and the memory transistors Qm is a Fin Field Effect Transistor (Fin-FET) having the surface (upper surface and side surfaces) of the fin FA as a channel, that is, a fin-type field effect transistor.

Since the layout of the memory array including the wiring layers of the present embodiment is the same as the layout shown in FIG. 1, the select gate electrode SG and the dummy select gate electrode SGI are collectively formed in the first region QsR, the memory gate electrodes MG and the dummy memory gate electrodes MGI are collectively formed in the second region QmR, and the first region QsR and the second region QmR are arranged side by side in the Y direction. That is, the drain region D1 of the select transistor Qs and the source region S2 of the memory transistor Qm are connected to each other by a wiring having a symmetrical structure with the boundary between the first region QsR and the second region QmR as an axis, similarly to the first embodiment. The set of select transistor Qs and the memory transistor Qm electrically connected in this manner configures one memory cell (bit).

The semiconductor device of the present embodiment can be formed by forming the fins FA, FB and the element isolation regions EI in the manufacturing step and then performing the same step as that of the first embodiment.

In other words, in the manufacturing step of the semiconductor device of the present embodiment, first, after the semiconductor substrate SB is prepared, the fins FA and FB protruded from the upper surface of the semiconductor substrate SB are formed. That is, patterns of insulating films serving as hard masks are formed on the semiconductor substrate SB. Thereafter, dry etching is performed using the patterns as etching protective masks, thereby retracting part of the upper surface of the semiconductor substrate SB. As a result, a plurality of trenches are formed in the upper surface of the semiconductor substrate SB, and the fin FA sandwiched between the two trenches is formed in the first region QsR. At the same time, the fin FB is formed in the second region QmR.

Subsequently, an insulating film formed of a silicon oxide film, for example, is embedded in each of the plurality of trenches to form element isolation regions EI formed of the insulating film. That is, after a silicon oxide film is formed on the semiconductor substrate SB by CVD method or the like, the upper surface of the silicon oxide film is retracted downward to form element isolation regions EI formed of the silicon oxide film. By performing the etch-back in this manner, part of the upper portions of the fins FA protrude from the upper surfaces of the element isolation regions EI.

Thereafter, a semiconductor device including the FINFET of the present embodiment can be formed by performing the same step as the step after the element isolation regions EI are formed among the steps described with reference to FIG. 6 and FIG. 7.

In the present embodiment, the same effects as those of the first embodiment can be obtained. That is, when the same memory cell as that of the compared example described with reference to FIG. 13 is formed on the fin, it is considerable that the select transistor Qs and the memory transistor Qm which are arranged side by side on one fin and electrically connected via the n-type semiconductor region shared with each other, are arranged side by side in the gate length direction. In the semiconductor device of the compared example, since the select transistor Qs and the memory transistor Qm configuring the memory cell are arranged in the gate length direction without interposing the element isolation region EI therebetween, the margin between the gate dielectric film IF1 and the ONO film C1 is small, and the withstand voltage may be lowered due to a shift of the exposure position or the like. Therefore, it is difficult to prevent the reliability of the memory cell from decreasing while preventing the area of the semiconductor device from increasing. In addition, since the margin for the shift of the exposure position is small, there is a problem that the yield is lowered.

In contrast, in the present embodiment, as shown in FIG. 1 and FIG. 9 to FIG. 11, by collectively forming the select transistors Qs and the memory transistors Qm in separate regions, the sizes of the patterns such as the gate electrodes and the gate dielectric films and the distances between the patterns can be increased, and the control at the boundaries between the patterns becomes less strict. Therefore, the respective margins between end of the gate electrode and end of the gate dielectric film and between end of the gate dielectric film IF1 and end of the ONO film C1 facing each other can be ensured to be large. Therefore, as shown in FIG. 13, it can be prevented that the gate electrode (the select gate electrode SG or the memory gate electrode MG) is formed on the outer side of the gate dielectric film (gate dielectric film IF1 or the ONO film C1). In addition, it is possible to prevent the ONO film C1 from remaining on the gate dielectric film IF1.

Here, a first region QsR in which a plurality of select transistors Qs are formed and a second region QmR in which a plurality of memory transistors Qm are formed are arranged in the gate width direction of the transistors. As a result, the select gate electrodes SG and the memory gate electrodes MG facing each other across the boundary between the first region QsR and the second region QmR can be terminated on the element isolation region EI. That is, in the compared example, the boundary portion for forming the ONO film and the I/O oxide film exists on the active region, whereas in the present embodiment, the boundary portion for forming the ONO film and the I/O oxide film exists only on the element isolation region EI (see FIG. 4). Therefore, even if a part of the gate electrode is formed on the outer side of the gate dielectric film, the part of the gate electrode is not in contact with the upper surface of the semiconductor substrate SB but in contact with the upper surface of the element isolation region EI.

Further, in the present embodiment, since the end portion of the gate dielectric film in the gate width direction (Y direction) can be terminated on the element isolation region EI (see FIG. 4), even if silicon residues or the like are generated in the vicinity of the termination portion of the gate dielectric film, the silicon residues can be prevented from affecting the semiconductor device.

As described above, it is possible to prevent the breakdown voltage between the select gate electrode SG and the memory gate electrode MG and the semiconductor substrate SB from decreasing, so that the reliability of the semiconductor device can be improved.

In the present embodiment, even if the base process is a leading-edge process of, for example, several tens of nanometers, the specification of masks (reticles) required for forming the memory cells may be a specification for forming rough patterns such as linear patterns (I lines). This facilitates patterning and reduces the cost of adding masks and adding photolithography process, respectively. In addition, it is possible to prevent the yield from decreasing due to misalignment of the exposure position or the like. In addition, since the pattern can be easily formed, the man-hour required for completing the new memory mixed mounting work can be reduced.

In the present embodiment, as shown in FIGS. 1 to 3, dummy select gate electrodes SGI arranged with the select gate electrodes SG in the first region QsR and dummy memory gate electrodes MGI arranged with the memory gate electrodes MG in the second region QmR are formed. As a result, it is not necessary to separate the select transistors Qs arranged in the X direction (gate length direction) from each other by the element isolation region EI, and it is not necessary to separate the memory transistors Qm arranged in the X direction (gate length direction) from each other by the element isolation region EI.

Therefore, the active region defined by the element isolation region EI is configured only by a layout in which a plurality of patterns extending in the X direction are arranged in the Y direction. That is, since the layout of the active region can be simplified, the present invention can be easily applied to a FINFET. Further, the specification of the mask (reticle) necessary for forming the active region of the memory cell may be a specification for forming a rough pattern such as a linear pattern (I line). This facilitates patterning and reduces semiconductor device manufacturing costs. Further, by simplifying the layout of the active region, it is possible to prevent the reliability of the semiconductor device and the yield of the semiconductor device from being lowered due to the shift of the exposure position.

Although the invention made by the present inventors has been specifically described based on the embodiments, the present invention is not limited to the embodiments, and various modifications can be made without departing from the gist thereof.

What is claimed is:
1. A semiconductor device comprising:
a semiconductor substrate having a first region on which a plurality of select transistors are formed and a second region in which a plurality of memory transistors are formed,
wherein each of the plurality of select transistors comprises:
a first gate electrode formed on the semiconductor substrate via a first dielectric film and extending in a first direction in plan view; and
a first source region and a first drain region formed in an upper surface of the semiconductor substrate and sandwiching the first gate electrode in a second direction intersecting with the first direction in plan view,
wherein each of the plurality of memory transistors comprises:
a second gate electrode formed on the semiconductor substrate via a second dielectric film including a charge storage film and extending in the first direction; and
a second source region and a second drain region formed in the upper surface of the semiconductor substrate and sandwiching the second gate electrode in the second direction,
wherein the first region and the second region are adjacent to each other in the first direction, and wherein a pair of the select transistor and the memory transistor in which the first drain region and the second source region are electrically connected to each other configure a memory cell.

2. The semiconductor device according to claim 1, wherein each of the end portion of the first dielectric film and the end portion of the second dielectric film facing each other across a boundary between the first region and the second region terminates on an element isolation region formed on the semiconductor substrate.

3. The semiconductor device according to claim 1, wherein the select transistor and the memory transistor configuring the memory cell are electrically connected to each other by a wiring formed over each of the select transistor and the memory transistor.

4. The semiconductor device according to claim 3, wherein the first drain region of the select transistor configuring the memory cell and the second source region of the memory transistor configuring the memory cell are arranged in the first direction.

5. The semiconductor device according to claim 1, wherein the plurality of select transistors include a first select transistor and a second select transistor arranged each other in the first direction,
wherein the plurality of memory transistors include a first memory transistor and a second memory transistor arranged each other in the first direction,
wherein the first select transistor and the first memory transistor configuring a first memory cell are electrically connected to each other by a first wiring formed over each of the first select transistor and the first memory transistor, and
wherein the second select transistor and the second memory transistor configuring a second memory cell are electrically connected to each other by a second wiring formed over the first wiring.

6. The semiconductor device according to claim 5, wherein the second select transistor, the first select transistor, the first memory transistor, and the second memory transistor are arranged in order in the first direction.

7. The semiconductor device according to claim 6, wherein the first wiring and the second wiring overlap each other in plan view directly over the boundary between the first region and the second region.

8. The semiconductor device according to claim 1, wherein the plurality of select transistors include a first select transistor and a second select transistor arranged each other in the first direction,
wherein the plurality of memory transistors include a first memory transistor and a second memory transistor arranged each other in the first direction,
wherein the first select transistor and the first memory transistor configuring the first memory cell are electrically connected to each other by a third wiring formed over each of the first select transistor and the first memory transistor, and
wherein the second select transistor and the second memory transistor configuring the second memory cell are electrically connected to each other by a fourth wiring arranged with the third wiring directly over the boundary between the first region and the second region.

9. The semiconductor device according to claim 8, wherein the first select transistor, the second select transistor, the first memory transistor and the second memory transistor are arranged in order in the first direction.

10. The semiconductor device according to claim 1, comprising:
a dummy third gate electrode formed on a first active region defined by an element isolation region in the first region via the first dielectric film, and extending in the first direction; and
a dummy fourth gate electrode formed on a second active region defined by the element isolation region in the second region via the second insulating film, and extending in the first direction,
wherein the third gate electrode is located between the first gate electrodes of the two select transistors which are adjacent in the second direction and formed on the first active region, and
wherein the fourth gate electrode is located between the second gate electrodes of the two memory transistors which are adjacent in the second direction and formed on the second active region.

11. The semiconductor device according to claim 10, wherein 0V is applied to each of the third gate electrode and the fourth gate electrode during read operation of the memory cell.

12. The semiconductor device according to claim 1, comprising:
an element isolation region formed on the semiconductor substrate and isolating the select transistor and the memory transistor adjacent in the first direction from each other,
wherein a distance between a boundary between the first region and the second region and an end portion of the element isolation region in the first direction is 200 nm to 400 nm.

13. The semiconductor device according to claim 1, comprising:
a first protruding portion being a part of the semiconductor substrate in the first region, protruded from an upper surface of the semiconductor substrate and extending in the second direction, and
a second protruding portion being a part of the semiconductor substrate in the second region, protruded from an upper surface of the semiconductor substrate and extending in the second direction,
wherein the first gate electrode covers an upper surface and a side surface of the first protruding portion,
wherein the first source region and the first drain region are formed in the first protruding portion,
wherein the second gate electrode covers an upper surface and a side surface of the second protruding portion, and
wherein the second source region and the second drain region are formed in the second protruding portion.

14. A semiconductor device comprising:
a semiconductor substrate having a first region and a second region which is different from the first region in plan view;
a plurality of select transistors formed on the first region of the semiconductor substrate, each of the plurality of select transistors including a first gate electrode extending in a first direction in plan view and a first source region and a first drain region formed in an upper surface of the semiconductor substrate such that the first gate electrode is located between the first source region and the first drain region in a second direction intersecting with the first direction in plan view; and a plurality of memory transistors formed on the second region of the semiconductor substrate, each of the plurality of memory transistors including a second gate electrode extending in the first direction in plan view and a second source region and a second drain region formed in an upper surface of the semiconductor substrate such that the second gate electrode is located between the second source region and the second drain region in the second direction in plan view;

wherein each of the plurality of memory transistors includes a charge storage film under the second gate electrode, wherein the first region and the second region are adjacent to each other in the first direction, and wherein a selected one of the plurality of select transistors and a selected one of the plurality of memory transistors are electrically connected with each other by wirings extending in the first direction, thereby to configure a memory cell.

* * * * *